United States Patent
Song et al.

(10) Patent No.: US 9,893,124 B2
(45) Date of Patent: Feb. 13, 2018

(54) ORGANIC LIGHT-EMITTING DISPLAY

(71) Applicant: Samsung Display Co., Ltd., Yongin (KR)

(72) Inventors: Ha Jin Song, Hwaseong-si (KR); Dal Ho Kim, Seongnam-si (KR); Heun Seung Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 134 days.

(21) Appl. No.: 14/510,697

(22) Filed: Oct. 9, 2014

(65) Prior Publication Data
US 2015/0318509 A1    Nov. 5, 2015

(30) Foreign Application Priority Data

Apr. 30, 2014  (KR) .................. 10-2014-0052598

(51) Int. Cl.
  *H01L 29/08* (2006.01)
  *H01L 35/24* (2006.01)
  (Continued)

(52) U.S. Cl.
  CPC ...... *H01L 27/3211* (2013.01); *H01L 27/3216* (2013.01); *H01L 51/5004* (2013.01); *H01L 51/5008* (2013.01); *H01L 51/5012* (2013.01); *H01L 51/5016* (2013.01); *H01L 51/5056* (2013.01); *H01L 51/5072* (2013.01); *H01L 51/5092* (2013.01); *H01L 51/5096* (2013.01); *H01L 51/5265* (2013.01);
  (Continued)

(58) Field of Classification Search
  USPC .......................................... 257/40
  See application file for complete search history.

(56) References Cited

U.S. PATENT DOCUMENTS

2008/0111480 A1* 5/2008 Lee .................. H01L 51/5012
                                                                313/504
2009/0261360 A1* 10/2009 Yasukawa ......... H01L 51/5044
                                                                257/89

(Continued)

FOREIGN PATENT DOCUMENTS

JP    2012-146764    8/2012
JP    2012-186021    9/2012

(Continued)

*Primary Examiner* — Telly Green
(74) *Attorney, Agent, or Firm* — H.C. Park & Associates, PLC

(57) ABSTRACT

An organic light-emitting display including a substrate having a first pixel area to emit a light of a first color and a second pixel area to emit a light of a second color, a first anode disposed on the first pixel area and a second anode disposed on the second pixel area, a first emitting layer disposed on the first anode and a second emitting layer disposed on the second anode, the first emitting layer including a fluorescent light-emitting material and the second emitting layer including a first phosphorescent light-emitting material, a first buffer layer disposed on the first emitting layer and a second buffer layer disposed on the second emitting layer, the first buffer layer and the second buffer layer being formed of different materials, and a first cathode disposed on the first buffer layer and a second cathode disposed on the second buffer layer.

19 Claims, 12 Drawing Sheets

(51) Int. Cl.
*H01L 51/00* (2006.01)
*H01L 27/32* (2006.01)
*H01L 51/50* (2006.01)
*H01L 51/52* (2006.01)

(52) U.S. Cl.
CPC ........ *H01L 51/006* (2013.01); *H01L 51/0058* (2013.01); *H01L 51/0065* (2013.01); *H01L 51/0072* (2013.01); *H01L 51/0085* (2013.01); *H01L 2251/5376* (2013.01); *H01L 2251/552* (2013.01)

(56) References Cited

U.S. PATENT DOCUMENTS

| | | | | |
|---|---|---|---|---|
| 2009/0325451 | A1* | 12/2009 | Higo | H01L 51/0013 445/24 |
| 2013/0075768 | A1* | 3/2013 | Kim | H01L 51/0016 257/88 |
| 2013/0207084 | A1* | 8/2013 | Im | H01L 27/3211 257/40 |
| 2014/0183482 | A1* | 7/2014 | Lee | H01L 51/5064 257/40 |
| 2014/0284566 | A1* | 9/2014 | Yoo | H01L 51/5012 257/40 |
| 2014/0367649 | A1* | 12/2014 | Cho | H01L 51/0067 257/40 |

FOREIGN PATENT DOCUMENTS

| | | | |
|---|---|---|---|
| KR | 10-2012-0108897 | | 10/2012 |
| KR | 10-2013-0052921 | | 5/2013 |
| KR | 10-2013-0068920 | | 6/2013 |
| KR | 10-2013-0070671 | | 6/2013 |
| KR | 10-2013-0093327 | | 8/2013 |
| KR | 10-1306840 | | 9/2013 |
| KR | 10-2014-0115688 | * | 1/2014 |

* cited by examiner

ORGANIC LIGHT-EMITTING DISPLAY

CROSS-REFERENCE TO RELATED APPLICATION

This application claims priority from and the benefit under 35 U.S.C. § 119(a) of Korean Patent Application No. 10-2014-0052598, filed on Apr. 30, 2014, the entire disclosure of which is incorporated herein by reference for all purpose.

BACKGROUND

Field

The present disclosure relates to an organic light-emitting display.

Discussion of the Background

Generally, an organic light-emitting display includes an anode, a cathode, and organic layers interposed between the anode and the cathode. The organic layers include at least an emitting layer and may further include a hole injecting layer, a hole transport layer, an electron transport layer and an electron injecting layer. In the organic light-emitting display, holes and electrons generated by the anode and the cathode may combine in an organic layer, particularly, in the emitting layer to form excitons. When an energy level of the excitons changes from an excited state to a ground state, the emitting layer may emit light of a color corresponding to the changed energy level.

A light-emitting material used in the emitting layer may be a fluorescent light-emitting material or a phosphorescent light-emitting material. Fluorescent light-emitting materials of most colors have a long life and high reliability. However, since a fluorescent light-emitting material converts only singlet excitons into light, its internal quantum efficiency is limited to a maximum of 25%. On the other hand, a phosphorescent light-emitting material can convert both singlet excitons and triplet excitons into light. Thus, the internal quantum efficiency of the phosphorescent light-emitting material is expected to be close to 100%. However, while phosphorescent light-emitting materials of some colors have a long life and are highly reliable, phosphorescent light-emitting materials of other colors have a relatively short life and low reliability.

To achieve desired levels of luminous efficiency, life, and reliability, some of the emitting layers included in one organic light-emitting display should be formed of a phosphorescent light-emitting material, and the other emitting layers should be formed of a fluorescent light-emitting material.

In addition, to increase the luminous efficiency of an organic light-emitting display, a buffer layer should be interposed between the emitting layers and the cathode. The buffer layer improves electron transfer characteristics from a cathode to the emitting layers. Further, the buffer layer blocks holes arriving from an anode from escaping from the emitting layers. Since a phosphorescent light-emitting material and a fluorescent light-emitting material are based on different emission principles, different buffer layers may be applied to an emitting layer formed of the phosphorescent light-emitting material and an emitting layer formed of the fluorescent light-emitting material.

The above information disclosed in this Background section is only for enhancement of understanding of the background of the inventive concept, and, therefore, it may contain information that does not form the prior art that is already known in this country to a person of ordinary skill in the art.

SUMMARY

Exemplary Embodiments provide an organic light-emitting display in which different buffer layers are applied to an emitting layer formed of a phosphorescent light-emitting material and an emitting layer formed of a fluorescent light-emitting material so as to improve the luminous efficiency of the organic light-emitting display.

Additional aspects will be set forth in the detailed description which follows, and, in part, will be apparent from the disclosure, or may be learned by practice of the inventive concept.

Exemplary embodiments of the present invention provides an organic light-emitting display including a substrate having a first pixel area configured to emit a light of a first color and a second pixel area configured to emit a light of a second color different from the first color, a first anode disposed on the first pixel area and a second anode disposed on the second pixel area, a first emitting layer disposed on the first anode and a second emitting layer disposed on the second anode, the first emitting layer including a fluorescent light-emitting material and the second emitting layer including a first phosphorescent light-emitting material, a first buffer layer disposed on the first emitting layer and a second buffer layer disposed on the second emitting layer, the first buffer layer and the second buffer layer being formed of different materials, and a first cathode disposed on the first buffer layer and a second cathode disposed on the second buffer layer.

Exemplary embodiments of the present invention provide an organic light-emitting display including a first pixel area disposed on a substrate and configured to emit a light of a first color; a second pixel disposed on the substrate and configured to emit a light of a second color different from the first color; a first anode disposed across from a first cathode, a first emitting layer interposed between the first anode and the first cathode, the first emitting layer including a fluorescent light-emitting material; a first buffer layer interposed between the first emitting layer and the first cathode, the first buffer layer disposed on the first pixel area; a second anode disposed across from a second cathode, a second emitting layer interposed between the second anode and the second cathode, the second emitting layer including a phosphorescent light-emitting material, a second buffer layer interposed between the second emitting layer and the second cathode, the second buffer layer disposed on the second pixel area, in which a highest occupied molecular orbital (HOMO) level and a lowest unoccupied molecular orbital (LUMO) level of the first buffer layer are lower than a HOMO level and a LUMO level of the second buffer layer.

Exemplary embodiments of the present invention provide an organic light-emitting display including a substrate having a first pixel area configured to emit a light of a first color, a first anode disposed on the first pixel area of the substrate, a first emitting layer disposed on the first anode, the first emitting layer including a fluorescent light-emitting material, a first buffer layer disposed on the first emitting layer, a second buffer layer disposed on the first buffer layer, and a first cathode disposed on the second buffer layer, in which a HOMO level and a LUMO level of the first buffer layer are lower than a HOMO level and a LUMO level of the second buffer layer.

It is to be understood that both the foregoing general description and the following detailed description are exemplary and explanatory and are intended to provide further explanation of the invention as claimed. Other features and aspects will be apparent from the following detailed description, the drawings, and the claims.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain the principles of the inventive concept.

DETAILED DESCRIPTION OF THE ILLUSTRATED EMBODIMENTS

Figure 1:
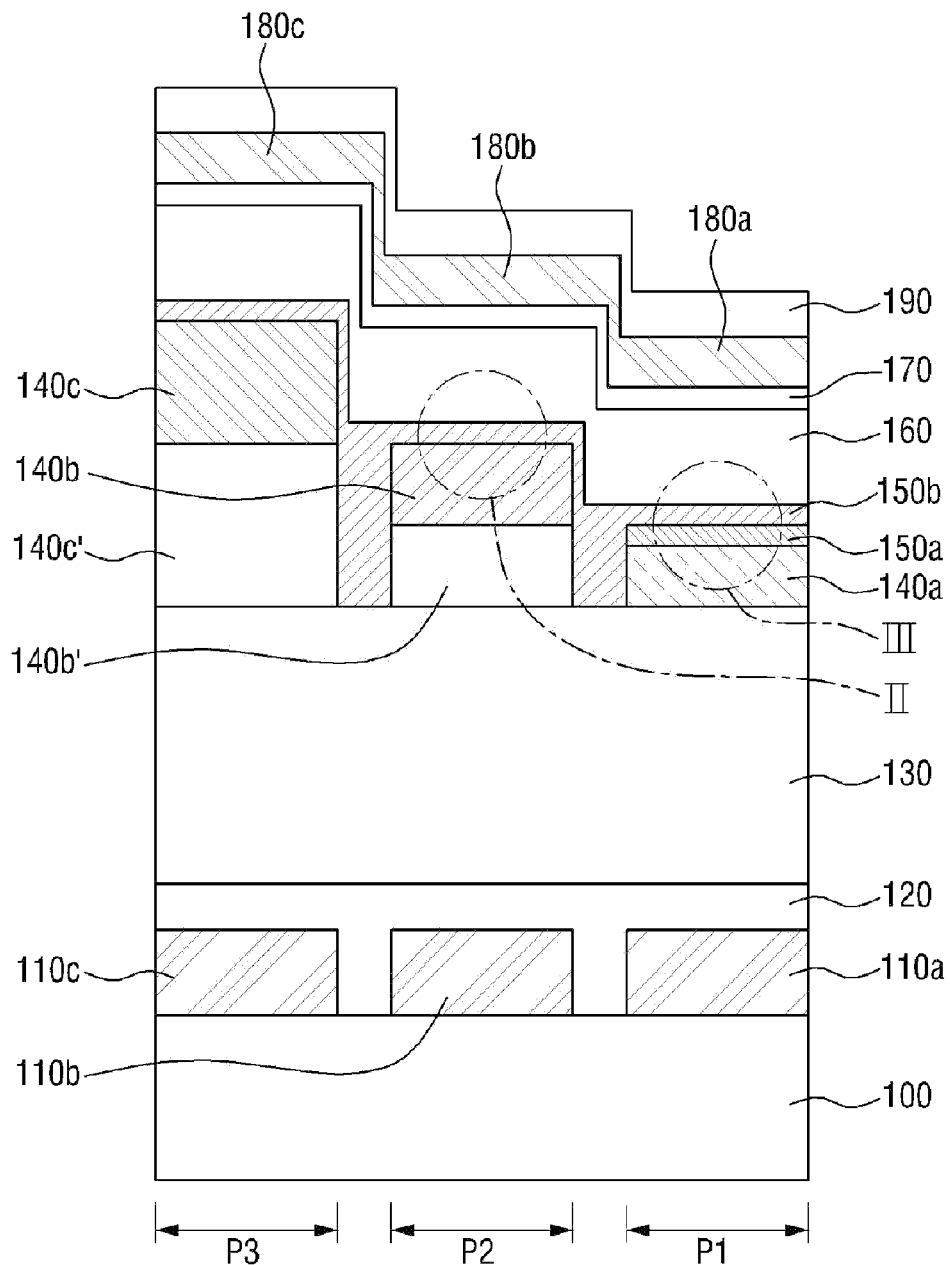
FIG. 1 is a schematic cross-sectional view of an organic light-emitting display according to an exemplary embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, aspects of the invention will be described with reference to the attached drawings.

FIG. 1 is a schematic cross-sectional view of an organic light-emitting display according to an exemplary embodiment of the present invention.

Referring to FIG. 1, the organic light-emitting display includes a substrate 100, a plurality of anodes (a first anode 110a, a second anode, and a third anode 110c), a P-hole transport layer 120, a hole transport layer 130, a plurality of auxiliary layers (a first auxiliary layer 140b' and a second auxiliary layer 140c'), a plurality of emitting layers (a first emitting layer 140a, a second emitting layer 140b, and a third emitting layer 140c), a plurality of buffer layers (a first buffer layer 150a and a second buffer layer 150b), an electron transport layer 160, an electron injecting layer 170, a plurality of cathodes (a first cathode 180a, a second cathode 180b, and a third cathode 180c), and a passivation layer 190.

The substrate 100 may include an insulating substrate. The insulating substrate may be formed of a transparent glass material containing transparent $SiO_2$ as its main component. In an example, the insulating substrate may be formed of an opaque material or a plastic material. Further, the insulating substrate may be a flexible substrate that can be bent, folded, or rolled.

Although not shown in FIG. 1, the substrate 100 may further include other structures formed on the insulating substrate. Examples of the structures may include wirings and insulating layers. If an organic light-emitting display is an active-matrix organic light-emitting display, the substrate 100 may include a plurality of thin-film transistors (TFTs) formed or disposed on the insulating substrate. Each of the TFTs may include a gate electrode, a source electrode, and a drain electrode, and a semiconductor layer including a channel region. The semiconductor layer may be formed of amorphous silicon, microcrystalline silicon, polycrystalline silicon, monocrystalline silicon, or an oxide semiconductor. The drain electrodes of at least some of the TFTs may be electrically connected to at least one of the anodes, such as the first anode 110a, the second anode 110b, and/or the third anode 110c.

The substrate 100 may include multiple pixel areas, such as a first pixel area P1, a second pixel area P2, and a third pixel area P3. The multiple pixel areas (the first pixel area P1, the second pixel area P2, and the third pixel area P3) may be disposed on the substrate 100. The multiple pixel areas formed on the substrate 100 may be separated from each other by a predetermined distance. The first pixel area P1, the second pixel area P2, and the third pixel area P3 may correspond to locations where a plurality of pixels are located.

The first pixel area P1 may emit light of a first color. The first color may be, for example, blue. The second pixel area P2 may emit light of a second color different from the first color. The second color may be, for example, green. The third pixel area P3 may emit light of a third color different from the first and second colors. The third color may be, for example, red. Although colors of blue, green, and red were being indicated as the first color, second color, and the third color, aspects of the invention are not limited thereto. According to aspects of the invention, the multiple pixel areas (the first pixel area P1, the second pixel area P2, and the third pixel area P3) may additionally include a fourth pixel area (not shown). The fourth pixel area may emit light of a fourth color different from the first through third colors. The fourth color may be, for example, white. However, aspects of the invention are not limited thereto, such that the multiple pixel areas may include additional pixel areas, and the colors corresponding to the pixel area are not limited thereto.

The multiple anodes, inclusive of the first anode 110a through the third anode 110c, may be disposed on the substrate 100. More specifically, the first anode 110a through the third anode 110c, may be interposed between the substrate 100 and the P-hole transport layer 120. The multiple anodes (first anode 110a through third anode 110c) may be located on the multiple pixel areas (first pixel area P1 through third pixel area P3) of the substrate 100, respectively. The multiple anodes (first anode 110a through third anode 110c) may be separated from each other to correspond to the pixels, respectively. Further, the multiple anodes (first anode 110a through third anode 110c) may be driven independently.

The first anode 110a may be located or disposed on the first pixel area P1 of the substrate 100. The second anode 110b may be located or disposed on the second pixel area P2 of the substrate 100. The third anode 110c may be located or disposed on the third pixel area P3 of the substrate 100. According to aspects of the invention, the multiple anodes (first anode 110a through third anode 110c) may directly contact the substrate 100. Further, a material, such as an insulating layer may be interposed between the multiple anodes (first anode 110a through third anode 110c) and the substrate 100.

The multiple anodes (first anode 110a through third anode 110c) may be formed of a conductive material having a high work function. Further, one or more of the anodes may be formed of a material having conductivity above a reference value or a highly conductive material. If the organic light-emitting display is of a bottom emission type, one or more of the multiple anodes may be formed of a material, such as indium tin oxide (ITO), indium zinc oxide (IZO), zinc oxide (ZnO) or indium (III) oxide ($In_2O_3$) or may be formed of a stacked layer of these materials. If the organic light-emitting display is of a top emission type, one or more of the multiple anodes may further include a reflective layer formed of Ag, Mg, Al, Pt, Pd, Au, Ni, Nd, Ir, Cr, Li or Ca. The multiple anodes (first anode 110a through third anode 110c) can be modified in various ways, for example, an anode may be configured to have a structure composed of two or more layers formed using two or more different materials selected from the above materials. The multiple anodes (first anode 110a through third anode 110c) may be formed by, for example, a sputtering process using a fine metal mask (FMM).

Although not shown in FIG. 1, a pixel defining layer may be interposed between two or more anodes (e.g., first anode 110a through third anode 110c) to divide the pixels from each other. The pixel defining layer may be disposed on the substrate 100 and include openings that respectively expose regions where the multiple anodes (first anode 110a through third anode 110c) may be located. The pixel defining layer may be formed of at least one organic material selected from benzocyclobutene (BCB), polyimide (PI), polyamide (PA), acrylic resin and phenolic resin. Further, the pixel defining layer may be formed of an inorganic material, such as silicon nitride.

The P-hole transport layer 120 may be located on the multiple anodes (first anode 110a through third anode 110c).

More specifically, the P-hole transport layer 120 may be interposed between the multiple anodes (first anode 110a through third anode 110c) and the hole transport layer 130. The P-hole transport layer 120 may smoothly transport holes arriving from one or more of the multiple anodes (first anode 110a through third anode 110c) to the hole transport layer 130. The P-hole transport layer 120 may be divided into a plurality of sections corresponding respectively to the pixels. Alternatively, the P-hole transport layer 120 may be formed as a single piece over the whole surface of the substrate 100, as shown in FIG. 1. More specifically, the P-hole transport layer 120 may be disposed as a common layer regardless of the division between the pixels, such that the P-hole transport layer 120 may be disposed on all of the pixel areas P1 through P3.

The P-hole transport layer 120 may be formed by doping a known hole transport material with a P-type dopant. According to aspects of the invention, the P-hole transport layer 120 may be formed by doping with the P-type dopant 1,3,5-tricarbazolyl benzene, 4,4'-biscarbazolylbiphenyl, polyvinylcarbazole, m-biscarbazolylphenyl, 4,4'-biscarbazolyl-2,2'-dimethylbiphenyl, 4,4',4"-tri(N-carbazolyl)triphenylamine, 1,3,5-tri(2-carbazolylphenyl)benzene, 1,3,5-tris(2-carbazolyl-5-methoxyphenyl)benzene, bis(4-carbazolylphenyl)-silane, N,N'-bis(3-methylphenyl)-N,N'-diphenyl-[1,1-biphenyl]-4,4'-diamine (TPD), N,N'-di(naphtalene-1-yl)-N,N'-diphenyl benzidine (NPD), N,N'-diphenyl-N,N'-bis(1-naphtyl)-(1,1'-biphenyl)-4,4'-diamine (NPB), poly(9,9-dioctylfluorene-co-N-(4-butylphenyl)diphenylamine) (TFB), or poly(9,9-dioctylfluorene-co-bis-(4-butylphenyl-bis-N,N-phenyl-1,4-phenylenediamin (PFB). The P-type dopant may be a material commonly used in the art to which the present invention pertains. Examples of the P-type dopant may include, without limitation, hexanitrile hexaazatriphenylene, tetrafluoro-tetracyanoquinodimethane ($F_4$-TCNQ), and vanadium oxide ($V_2O_5$). Further, a general hole injecting layer may be used instead of the P-hole transport layer 120.

The hole transport layer 130 may be located on the P-hole transport layer 120. More specifically, the hole transport layer 130 may be interposed between the P-hole transport layer 120 and the multiple emitting layers (first emitting layer 140a through third emitting layer 140c). The hole transport layer 130 may smoothly transport holes arriving from the P-hole transport layer 120 to the auxiliary layers (first auxiliary layer 140b' and second auxiliary layer 140c') and the emitting layers (first emitting layer 140a through third emitting layer 140c). The hole transport layer 130 may be divided into a plurality of sections corresponding respectively to the pixels. Alternatively, the hole transport layer 130 may be disposed as a single piece over the whole surface of the substrate 100, as shown in FIG. 1. More specifically, the hole transport layer 130 may be disposed as a common layer regardless of the division between the pixels, such that the hole transport layer 130 may be disposed on all of the pixel areas (first pixel area P1 through third pixel area P3).

The hole transport layer 130 may be formed of a known hole transport material. In an exemplary embodiment, the hole transport layer 130 may be formed of or include, without limitation, 1,3,5-tricarbazolyl benzene, 4,4'-biscarbazolylbiphenyl, polyvinylcarbazole, m-biscarbazolylphenyl, 4,4'-biscarbazolyl-2,2'-dimethylbiphenyl, 4,4',4"-tri(N-carbazolyl)triphenylamine, 1,3,5-tri(2-carbazolylphenyl)benzene, 1,3,5-tris(2-carbazolyl-5-methoxyphenyl)benzene, bis(4-carbazolylphenyl)-silane, N,N'-bis(3-methylphenyl)-N,N'-diphenyl-[1,1-biphenyl]-4,4'-diamine(TPD), N,N'-di(naphtalene-1-yl)-N,N'-diphenyl benzidine (NPD), N,N'-diphenyl-N,N'-bis(1-naphtyl)-(1,1'-biphenyl)-4,4'-diamine (NPB), poly(9,9-dioctylfluorene-co-N-(4-butylphenyl)diphenylamine) (TFB), poly(9,9-dioctylfluorene-co-bis-(4-butylphenyl-bis-N,N-phenyl-1,4-phenylenediamin (PFB), or a combination thereof.

The auxiliary layers (first auxiliary layer 140b' and second auxiliary layer 140c') may be disposed on the hole transport layer 130. The auxiliary layers (first auxiliary layer 140b' and second auxiliary layer 140c') may adjust the resonance cycle of light emitted from the emitting layers (first emitting layer 140a through third emitting layer 140c). More specifically, the auxiliary layers (first auxiliary layer 140b' and second auxiliary layer 140c') may improve the color purity, luminous efficiency, etc. of light emitted from the emitting layers (first emitting layer 140a through third emitting layer 140c).

The first auxiliary layer 140b' may be located or disposed on the second pixel area P2. In addition, the first auxiliary layer 140b' may be interposed between the second emitting layer 140b and the hole transport layer 130. The first auxiliary layer 140b' may be formed to an appropriate thickness to adjust the resonance cycle of light emitted from the second emitting layer 140b. The first auxiliary layer 140b' may be formed of the same material as the material that forms the P-hole transport layer 120 or the hole transport layer 130. However, aspects of the invention are not limited thereto, such that the first auxiliary layer 140b' may include at least one of silicon nitride ($SiN_x$), silicon oxide ($SiO_2$), and silicon oxynitride ($SiO_N$).

The second auxiliary layer 140c' may be located or disposed on the third pixel area P3. In addition, the second auxiliary layer 140c' may be interposed between the third emitting layer 140c and the hole transport layer 130. The second auxiliary layer 140c' may be formed to an appropriate thickness to adjust the resonance cycle of light emitted from the third emitting layer 140c. According to aspects of the invention, the second auxiliary layer 140c' may be thicker than the first auxiliary layer 140b' due to a difference in the resonance cycle of light. The second auxiliary layer 140c' may be formed of the same material as the material that forms the P-hole transport layer 120 or the hole transport layer 130. However, aspects of the invention are not limited thereto, such that the second auxiliary layer 140c' may include at least one of silicon nitride ($SiN_x$), silicon oxide ($SiO_2$), and silicon oxynitride ($SiO_N$). Further, the second auxiliary layer 140c' may be formed of the same material as the first auxiliary layer 140b'.

The emitting layers (first emitting layer 140a through third emitting layer 140c) may be disposed on the hole transport layer 130 and the auxiliary layers (first auxiliary layer 140b' and third auxiliary layer 140c'). One or more of the emitting layers (first emitting layer 140a through third emitting layer 140c) may emit light of a certain color. More specifically, holes and electrons generated by the anodes (first anode 110a through third anode 110c) and the cathodes (first cathode 180a through third cathode 180c) may combine in the emitting layers (first emitting layer 140a through third emitting layer 140c) to form excitons. When an energy level of the excitons changes from an excited state to a ground state, light of the corresponding emitting layer having a color may be emitted according to the changed energy level. According to aspects of the invention, the emitting layers (first emitting layer 140a through third emitting layer 140c) may emit at least one of a blue light, green light, and red light. Further, one or more of the emitting layers (first emitting layer 140a through third emitting layer 140*c*) may emit a white light in addition to, or instead of, the blue light, the green light and the red light.

According to aspects of the invention, the first emitting layer 140*a* may emit blue light, the second emitting layer 140*b* may emit green light, and the third emitting layer 140*c* may emit red light. However, aspects of the invention are not limited thereto, such that other colors may be emitted from the respective emitting layers.

The first emitting layer 140*a* may be located or disposed on the first pixel area P1. More specifically, the first emitting layer 140*a* may be interposed between the hole transport layer 130 and a first buffer layer 150*a*. The first emitting layer 140*a* may include a fluorescent light-emitting material. Hereinafter, the first emitting layer 140*a* will be described as including a blue fluorescent light-emitting material. However, aspects of the invention are not limited thereto, such that the first emitting layer 140*a* may include a fluorescent light-emitting material of another color.

The first emitting layer 140*a* may be formed of a polymer material or a small molecule organic material, which may emit blue light, or a mixture of the polymer material and the small molecule organic material. According to aspects of the invention, the first emitting layer 140*a* may include a blue host material and a blue dopant material.

The blue host material of the first emitting layer 140*a* may include one or more materials selected from, without limitation, an anthracene derivative and a carbazole compound. For example, the anthracene derivative may be 9,10-(2-dinaphthyl) anthracene (ADN), and the carbazole compound may be 4,4'-(carbazole-9-yl)biphenyl (CBP). The blue dopant material of the first emitting layer 140*a* may be, but is not limited to, 4,4'-bis[4-(di-p-tolylamino)styryl]biphenyl (DPAVBi), a DPAVBi derivative, distyrylarylene (DSA), a DSA derivative, distyrylbenzene (DSB), a DSB derivative, spiro-DPVBi, spiro-6P, and the like.

The second emitting layer 140*b* may be located or disposed on the second pixel area P2. More specifically, the second emitting layer 140*b* may be interposed between the first auxiliary layer 140*b*' and a second buffer layer 150*b*. The second emitting layer 140*b* may include a phosphorescent light-emitting material. Hereinafter, the second emitting layer 140*b* may be described as including a green phosphorescent light-emitting material will. However, aspects of the invention are not limited thereto, such that the second emitting layer 140*b* may include a phosphorescent light-emitting material of another color.

The second emitting layer 140*b* may be formed of a polymer material or a small molecule organic material, which may emit green light, or a mixture of the polymer material and the small molecule organic material. According to aspects of the invention, the second emitting layer 140*b* may include a green host material and a green dopant material.

The green host material of the second emitting layer 140*b* may include one or more materials selected from, without limitation, an anthracene derivative and a carbazole compound. The anthracene derivative may be 9,10-(2-dinaphthyl) anthracene (ADN), and the carbazole compound may be 4,4'-(carbazole-9-yl)biphenyl (CBP). According to aspects of the invention, the green host material of the second emitting layer 140*b* may be the same as the blue host material of the first emitting layer 140*a*. The green dopant material of the second emitting layer 140*b* may be, without limitation, [Coumarin 6], $Ir(ppy)_3$ (ppy=2-phenylpyridine), and the like.

The second emitting layer 140*b* may be disposed in the same chamber with the first auxiliary layer 140*b*'. According to aspects of the invention, a source including the green host material of the second emitting layer 140*b*, a source including the green dopant material of the second emitting layer 140*b*, and a source including the material that forms the first auxiliary layer 140*b*' may be placed within one chamber. Then, only the source including the material that forms the first auxiliary layer 140*b*' may be opened to form the first auxiliary layer 140*b*'. After the formation of the first auxiliary layer 140*b*', the source including the material that forms the first auxiliary layer 140*b*' may be closed. Next, the source including the green host material of the second emitting layer 140*b* and the source including the green dopant material of the second emitting layer 140*b* may be opened simultaneously or sequential order to form the second emitting layer 140*b*.

The third emitting layer 140*c* may be located or disposed on the third pixel area P3. More specifically, the third emitting layer 140*c* may be interposed between the second auxiliary layer 140*c*' and the second buffer layer 150*b*. The third emitting layer 140*c* may include a phosphorescent light-emitting material. Hereinafter, the third emitting layer 140*c* will be described as including a red phosphorescent light-emitting material. However, aspects of the invention are not limited thereto, such that the third emitting layer 140*c* may include a phosphorescent light-emitting material of another color.

The third emitting layer 140*c* may be formed of a polymer material or a small molecule organic material, which may emit red light, or a mixture of the polymer material and the small molecule organic material. According to aspects of the invention, the third emitting layer 140*c* may include a red host material and a red dopant material.

The red host material of the third emitting layer 140*c* may include one or more materials selected from, without limitation, an anthracene derivative and a carbazole compound. The anthracene derivative may be 9,10-(2-dinaphthyl) anthracene (ADN), and the carbazole compound may be 4,4'-(carbazole-9-yl)biphenyl (CBP). According to aspects of the invention, the red host material of the third emitting layer 140*c* may be the same as the blue host material of the first emitting layer 140*a*. The red dopant material of the third emitting layer 140*c* may be, without limitation, 4-(dicyanomethylene)-2-t-butyl-6-(1,1,7,7-tetramethyljulolidyl-9-enyl)-4H-pyran(4-(dicyanomethylene)-2-t-butyl-6-(1,1,7,7-tetramethyljulolidyl-9-enyl)-4H-pyran (DCJTB).

The third emitting layer 140*c* may be formed in the same chamber with the second auxiliary layer 140*c*'. According to aspects of the invention, a source including the red host material of the third emitting layer 140*c*, a source including the red dopant material of the third emitting layer 140*c*, and a source including the material that forms the second auxiliary layer 140*c*' may be placed within one chamber. Then, only the source including the material that forms the second auxiliary layer 140*c*' may be opened to form the second auxiliary layer 140*c*'. After the formation of the second auxiliary layer 140*c*', the source including the material that forms the second auxiliary layer 140*c*' may be closed. Next, the source including the red host material of the third emitting layer 140*c* and the source including the red dopant material of the third emitting layer 140*c* may be opened simultaneously or in sequential order to form the third emitting layer 140*c*.

The first buffer layer 150*a* may be located or disposed on the first pixel area P1. More specifically, the first buffer layer 150*a* may be interposed between the first emitting layer 140*a* and the electron transport layer 160. The first buffer layer 150a may block or impede holes arriving from the first anode 110a from emerging upward from the first emitting layer 140a.

The first buffer layer 150a may include a material that blocks or impedes the transportation of holes but facilitates the transportation of electrons. The first buffer layer 150a may include, but not limited to, firpic.

The first buffer layer 150a may be formed to have a thickness within a range of approximately 30 to 100 Å. The first buffer layer 150a having a thickness within the above specified range (30 to 100 Å) can prevent, block, or impede holes arriving from the first anode 110a from emerging upward from the first emitting layer 140a.

The first buffer layer 150a may be formed in the same chamber with the first emitting layer 140a. According to aspects of the invention, a source including the blue host material of the first emitting layer 140a, a source including the blue dopant material of the first emitting layer 140a, and a source including the material that forms the first buffer layer 150a may be placed within one chamber. Then, the source including the blue host material of the first emitting layer 140a and the source including the blue dopant material of the first emitting layer 140a may be opened simultaneously or in sequential order to form the first emitting layer 140a. After the formation of the first emitting layer 140a, the source including the blue host material of the first emitting layer 140a and the source including the blue dopant material of the first emitting layer 140a may be closed. Next, the source including the material that forms the first buffer layer 150a may be opened to form the first buffer layer 150a. If a set of the above three sources shuttle twice (e.g., two round trips or four trips in one direction) between both ends of the substrate 100 to form a structure on the substrate 100, the source including the blue host material of the first emitting layer 140a and the source including the blue dopant material of the first emitting layer 140a may be opened to form the first emitting layer 140a while they are moved to make the first three trips out of the four trips in one direction. Then, only the source including the material that forms the first buffer layer 150a may be opened to form the first buffer layer 150a while it is moved to make the fourth trip out of the four trips. More specifically, the first buffer layer 150a can be formed without the addition of a chamber as compared with a conventional process.

The second buffer layer 150b may be located or disposed on the first buffer layer 150a, the second emitting layer 140b, and the third emitting layer 140c. More specifically, the second buffer layer 150b may be interposed between the first buffer layer 150a, the second emitting layer 140b and the third emitting layer 140c and the electron transport layer 160. The second buffer layer 150b may enable electrons arriving from the cathodes (first cathode 180a through third cathode 180c) to be smoothly supplied to the second emitting layer 140b and the third emitting layer 140c. The second buffer layer 150b may be divided into a plurality of sections corresponding respectively to the pixels. Alternatively, the second buffer layer 150b may be formed as a single piece over the whole surface of the substrate 100, as shown in FIG. 1. More specifically, the second buffer layer 150b may be formed as a common layer regardless of the division between the pixels, such that the second buffer layer 150b may be formed on all of the pixel areas (first pixel area P1 through third pixel area P3). Further, the second buffer layer 150b may extend in a direction parallel to the electron transport layer, such that the second buffer layer 150b may be interposed between the second emitting layer 140b and the electron transport layer 160, between the third emitting layer 140c and the electron transport layer 160, and between the first buffer layer 150a and the electron transport layer 160.

The second buffer layer 150b may be formed of a different material from that of the first buffer layer 150a. According to aspects of the invention, the second buffer layer 150b may include a material having superior electron transfer characteristics. The second buffer layer 150b may include, but not limited to, CBP or Alq$_3$.

The second buffer layer 150b may be configured to have a thickness within a range of approximately 30 to 100 Å. The second buffer layer 150b having a thickness within the above specified range (approximately 30 to 100 Å) enables electrons arriving from the cathodes (first cathode 180a through third cathode 180c) to be smoothly supplied to the second emitting layer 140b and the third emitting layer 140c.

The electron transport layer 160 may be located or disposed on the second buffer layer 150b. Further, the electron transport layer 160 may be interposed between the second buffer layer 150b and the electron injecting layer 170. The electron transport layer 160 may be divided into a plurality of sections corresponding respectively to the pixels. Alternatively, the electron transport layer 160 may be disposed as a single piece over the whole surface of the substrate 100, as shown in FIG. 1. More specifically, the electron transport layer 160 may be disposed as a common layer regardless of the division between the pixels, such that the electron transport layer 160 may be disposed on all of the pixel areas (first pixel area P1 through third pixel area P3).

The electron transport layer 160 may be located or disposed on the second emitting layer 140b. The material that forms the electron transport layer 160 may stably transport electrons injected from the cathodes (first cathode 180a through third cathode 180c). The material that forms the electron transport layer 160 may be a known material (hereinafter, referred to as a host material of the electron transport layer 160), such as a quinoline derivative. The host material of the electron transport layer 160 may include, without limitation, tris(8-quinolinorate)aluminum (Alq$_3$), 3-(4-biphenylyl)-4-phenyl-5-(4-tert-butyl phenyl)-1,2,4-triazole (TAZ), Balq, etc. In addition, the electron transport layer 160 may be doped with one or more materials (hereinafter, referred to as a dopant material of the electron transport layer 160) selected from metal salt, metal oxide, and organic metal salt. The metal salt may be a halide of an alkali metal or an alkaline earth metal, such as LiF, NaF, KF, RbF, CsF, MgF$_2$, CaF$_2$, SrF$_2$, BaF$_2$, LiCl, NaCl, KCl, RbCl, CsCl, MgCl$_2$, CaCl$_2$, SrCl$_2$, BaCl$_2$, etc. The metal oxide may be an oxide of an alkali metal or an alkaline earth metal, such as LiO2, NaO$_2$, BrO$_2$, Cs$_2$O, MgO, CaO, etc. The organic metal salt may be Liq, Naq or Kq defined by formula (1) below:

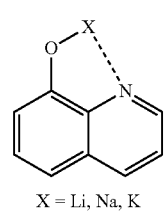

(1)

X = Li, Na, K

The electron transport layer 160 may be disposed in the same chamber with the second buffer layer 150b. According to aspects of the invention, a source including the host material of the electron transport layer 160, a source including the dopant material of the electron transport layer 160, and a source including the material that forms the second buffer layer 150b may be placed within one chamber. Then, the source including the material that forms the second buffer layer 150b may be opened to form the second buffer layer 150b. After the formation of the second buffer layer 150, the source including the material that forms the second buffer layer 150b may be closed. Next, the source including the host material of the electron transport layer 160 and the source including the dopant material of the electron transport layer 160 may be opened simultaneously to form the electron transport layer 160. When a set of the above three sources shuttle twice (e.g., two round trips or four trips one way) between both ends of the substrate 100 to form a structure on the substrate 100, the source including the material that forms the second buffer layer 150b may be opened to form the second buffer layer 150b while it is moved to make the first trip out of the four trips in one direction. Then, the source including the host material of the electron transport layer 160 and the source including the dopant material of the electron transport layer 160 may be opened to form the electron transport layer 160 while they are moved to make the remaining three trips out of the four trips. More specifically, the second buffer layer 150b can be formed without the addition of a chamber as compared with a conventional process.

The electron injecting layer 170 may be located or disposed on the electron transport layer 160. More specifically, the electron injecting layer 170 may be interposed between the electron transport layer 160 and the cathodes (first cathode 180a through third cathode 180c). The electron injecting layer 170 may be formed using a known electron injecting material, such as, without limitation, LiF, NaCl, CsF, $Li_2O$, BaO, or the like.

The cathodes (first cathode 180a through third cathode 180c) may be located on the electron injecting layer 170. More specifically, the cathodes (first cathode 180a through third cathode 180c) may be interposed between the electron injecting layer 170 and the passivation layer 190. The cathodes (first cathode 180a through third cathode 180c) may be formed of a conductive material having a low work function. Further, one or more of the cathodes may be formed of a material having conductivity below a reference value or a low conductive material. According to aspects of the invention, the cathodes (first cathode 180a through third cathode 180c) may be formed of, without limitation, Ag, Mg, Al, Pt, Pd, Au, Ni, Nd, Ir, Cr, Li, Ca, or the like.

The first cathode 180a may be located or disposed on the first pixel area P1. The second cathode 180b may be located or disposed on the second pixel area P2. The third cathode 180c may be located or disposed on the third pixel area P3. The first cathode 180a, the second cathode 180b, and the third cathode 180c may receive independent voltages. Alternatively, the first cathode 180a, the second cathode 180b, and the third cathode 180c may be disposed as a single piece and receive one common voltage.

The passivation layer 190 may be disposed on the cathodes (first cathode 180a through third cathode 180c). The passivation layer 190 may protect layers stacked thereunder. The passivation layer 190 may be formed of an insulating material. According to aspects of the invention, a spacer (not shown) may be disposed between the cathodes (first cathode 180a through third cathode 180c) and the passivation layer 190. However, aspects of the invention are not limited thereto, such that the passivation layer 190 may be omitted.

Figure 2:
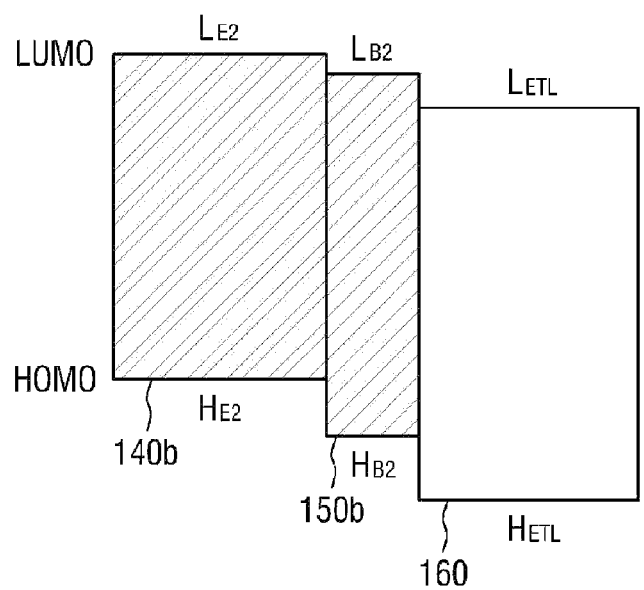
FIG. 2 is an energy diagram schematically illustrating highest occupied molecular orbital (HOMO) and lowest unoccupied molecular orbital (LUMO) levels of each layer located in a portion II of the organic light-emitting display of FIG. 1 according to exemplary embodiments of the present invention.

An energy diagram of the second emitting layer 140b, the second buffer layer 150b, and the electron transport layer 160 disposed on the second pixel area P2 will now be described in more detail with reference to FIG. 2. FIG. 2 is an energy diagram schematically illustrating highest occupied molecular orbital (HOMO) and lowest unoccupied molecular orbital (LUMO) levels of each layer located in a portion II of the organic light-emitting display of FIG. 1. HOMO and LUMO levels of the third emitting layer 140c may be substantially similar or equal to those of the second emitting layer 140b. An energy diagram of the third emitting layer 140c, the second buffer layer 150b and the electron transport layer 160 disposed on the third pixel area P3 may be substantially the same or similar as the energy diagram (illustrated in FIG. 2) of the second emitting layer 140b, the second buffer layer 150b, and the electron transport layer 160 disposed on the second pixel area P2. Accordingly, a description thereof will be omitted.

Referring to FIG. 2, a HOMO level $H_{B2}$ of the second buffer layer 150b may be lower than a HOMO level $H_{E2}$ of the second emitting layer 140b and higher than a HOMO level $H_{ETL}$ of the electron transport layer 160. For example, the HOMO level $H_{B2}$ of the second buffer layer 150b may be approximately −5.6 eV, the HOMO level $H_{E2}$ of the second emitting layer 140b may be approximately −5.4 eV, and the HOMO level $H_{ETL}$ of the electron transport layer 160 may be approximately −5.8 eV.

In addition, a LUMO level $L_{B2}$ of the second buffer layer 150b may be lower than a LUMO level $L_{E2}$ of the second emitting layer 140b and higher than a LUMO level $L_{ETL}$ of the electron transport layer 160. For example, the LUMO level $L_{B2}$ of the second buffer layer 150b may be approximately −2.5 eV, the LUMO level $L_{E2}$ of the second emitting layer 140b may be approximately −2.4 eV, and the LUMO level $L_{ETL}$ of the electron transport layer 160 may be approximately −2.8 eV.

An emission region of the second emitting layer 140b including a phosphorescent light-emitting material may be located near or within a reference proximity of the hole transport layer 130. Accordingly, improvement of transport characteristics of electrons from the electron transport layer 160 may be required or emphasized rather than blocking holes at an interface between the second emitting layer 140b and the electron transport layer 160. In this regard, the second buffer layer 150b with a HOMO level above a reference threshold and whose LUMO level is between the LUMO level $L_{E2}$ of the second emitting layer 140b and the LUMO level $L_{ETL}$ of the electron transport layer 160 may be interposed between the second emitting layer 140b and the electron transport layer 160.

Figure 3:
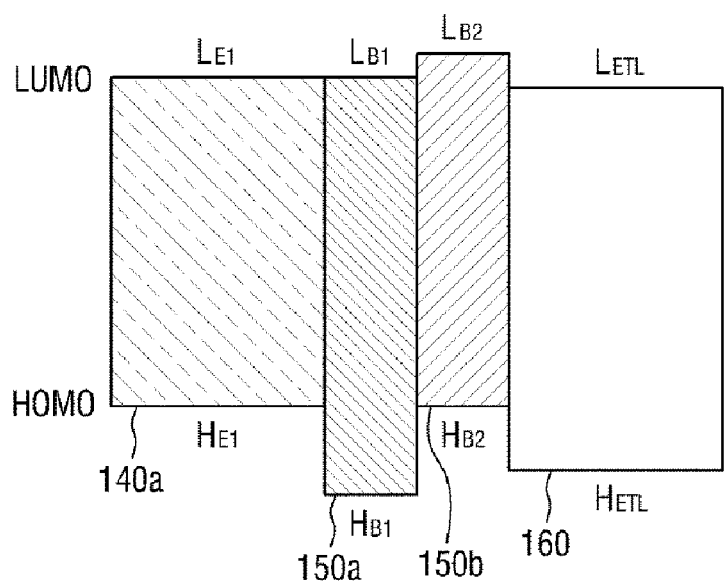
FIG. 3 is an energy diagram schematically illustrating HOMO and LUMO levels of each layer located in a portion III of the organic light-emitting display of FIG. 1 according to exemplary embodiments of the present invention.

An energy diagram of the first emitting layer 140a, the first buffer layer 150a, the second buffer layer 150b and the electron transport layer 160 disposed on the first pixel area P1 will now be described with reference to FIG. 3. FIG. 3 is an energy diagram schematically illustrating HOMO and LUMO levels of each layer located in a portion III of the organic light-emitting display of FIG. 1.

Referring to FIG. 3, a HOMO level $H_{E1}$ and a LUMO level $L_{E1}$ of the first emitting layer 140a including a fluorescent light-emitting material may respectively be lower than the HOMO level $H_{E2}$ and the LUMO level $L_{E2}$ of the second emitting layer 140b including the phosphorescent light-emitting material. For example, the HOMO level $H_{E1}$ and the LUMO level $L_{E1}$ of the first emitting layer 140a may respectively be approximately −5.6 eV and approximately −2.6 eV, and the HOMO level $H_{E2}$ and the LUMO level $L_{E2}$ of the second emitting layer 140b may respectively be approximately −5.4 eV and approximately −2.4 eV as described above. In addition, the first emitting layer 140a, which may have an emission region located near or within a reference proximity of the electron transport layer 160, may be different from the second emitting layer 140b, which may have the emission region located near or within a reference proximity of the hole transport layer 130. Since the first emitting layer 140a including the fluorescent light-emitting material and the second emitting layer 140b including the phosphorescent light-emitting material have different HOMO levels, different LUMO levels, and different emission regions, it may not possible to improve the luminous efficiencies of all of the emitting layers (first emitting layer 140a through third emitting layer 140c) using one buffer layer (e.g., second buffer layer 150b) alone. For this reason, the first buffer layer 150a as well as the second buffer layer 150b may be added to improve the luminous efficiencies of some or all of the emitting layers (first emitting layer 140a through third emitting layer 140c).

A HOMO level $H_{B1}$ of the first buffer layer 150a may be lower than the HOMO level $H_{E1}$ of the first emitting layer 140a. In an example, an absolute value of a difference between the HOMO level $H_{B1}$ of the first buffer layer 150a and the HOMO level $H_{E1}$ of the first emitting layer 140a may be approximately 0.2 eV or more. According to aspects of the invention, the HOMO level $H_{B1}$ of the first buffer layer 150a may be approximately −5.9 eV, and the HOMO level $H_{E1}$ of the first emitting layer 140a may be approximately −5.6 eV as described above. Here, the absolute value of the difference between the HOMO level $H_{B1}$ of the first buffer layer 150a and the HOMO level $H_{E1}$ of the first emitting layer 140a may be approximately 0.3 eV.

Since the emission region of the first emitting layer 140a including the fluorescent light-emitting material may be located near or within a reference proximity of the electron transport layer 160, holes at an interface between the first emitting layer 140a and the electron transport layer 160 may be blocked. Further, the first buffer layer 150a, which may have a HOMO level is lower than the HOMO level $H_{B2}$ of the second buffer layer 150b by a certain amount, may be interposed between the first emitting layer 140a and the second buffer layer 150b.

A LUMO level $L_{B1}$ of the first buffer layer 150a may be lower than the LUMO level $L_{B2}$ of the second buffer layer 150b and higher than or equal to the LUMO level $L_{E1}$ of the first emitting layer 140a. For example, the LUMO level $L_{B1}$ of the first buffer layer 150a may be approximately −2.6 eV, the LUMO level $L_{B2}$ of the second buffer layer 150b may be approximately −2.5 eV as described above, and the LUMO level $L_{E1}$ of the first emitting layer 140a may be approximately −2.6 eV as described above. Therefore, electrons arriving at the second buffer layer 150b can be naturally transported to the first emitting layer 140a without the application of a voltage.

The HOMO level $H_{B1}$ and the LUMO level $L_{B1}$ of the first buffer layer 150a may respectively be lower than the HOMO level $H_{B2}$ and the LUMO level $L_{B2}$ of the second buffer layer 150b. For example, the HOMO level $H_{B1}$ and the LUMO level $L_{B1}$ of the first buffer layer 150a may respectively be approximately −5.9 eV and approximately −2.6 eV, and the HOMO level $H_{B2}$ and the LUMO level $L_{B2}$ of the second buffer layer 150b may respectively be approximately −5.6 eV and approximately −2.5 eV. In addition, a band gap of the first buffer layer 150a may be greater than that of the second buffer layer 150b. For example, the band gap of the first buffer layer 150a may be approximately 3.3 eV, and the band gap of the second buffer layer 150b may be approximately 3.1 eV. Accordingly, the first buffer layer 150a disposed on the first emitting layer 140a may perform a hole-blocking function, and the second buffer layer 150b disposed on the second emitting layer 140b and the third emitting layer 140c may facilitate electron transfer.

The HOMO level $H_{B2}$ of the second buffer layer 150b may be higher than or equal to the HOMO level $H_{E1}$ of the first emitting layer 140a. For example, as described above, the HOMO level $H_{B2}$ of the second buffer layer 150b may be approximately −5.6 eV, and the HOMO level $H_{E1}$ of the first emitting layer 140b may be approximately −5.6 eV. In addition, the LUMO level $L_{B2}$ of the second buffer layer 150b may be higher than the LUMO level $L_{B1}$ of the first buffer layer 150a. For example, as described above, the LUMO level $L_{B2}$ of the second buffer layer 150b may be approximately −2.5 eV, and the LUMO level $L_{B1}$ of the first buffer layer 150a may be approximately −2.6 eV.

The HOMO level $H_{ETL}$ of the electron transport layer 160 may be lower than the HOMO level $H_{E1}$ of the first emitting layer 140a and higher than the HOMO level $H_{B1}$ of the first buffer layer 150a. For example, as described above, the HOMO level $H_{ETL}$ of the electron transport layer 160 may be approximately −5.8 eV, the HOMO level $H_{E1}$ of the first emitting layer 140b may be approximately −5.6 eV, and the HOMO level $H_{B1}$ of the first buffer layer 150a may be approximately −5.9 eV. In addition, the LUMO level $L_{ETL}$ of the electron transport layer 160 may be lower than the LUMO level $L_{E1}$ of the first emitting layer 140a. For example, as described above, the LUMO level $L_{ETL}$ of the electron transport layer 160 may be approximately −2.8 eV, and the LUMO level $L_{E1}$ of the first emitting layer 140a may be approximately −2.6 eV.

Since the second buffer layer 150b may be interposed between the first buffer layer 150a and the electron transport layer 160, emission characteristics of the first emitting layer 140a at low gray levels can be improved. The emission characteristics will now be described in more detail with reference to FIG. 4.

Figure 4:
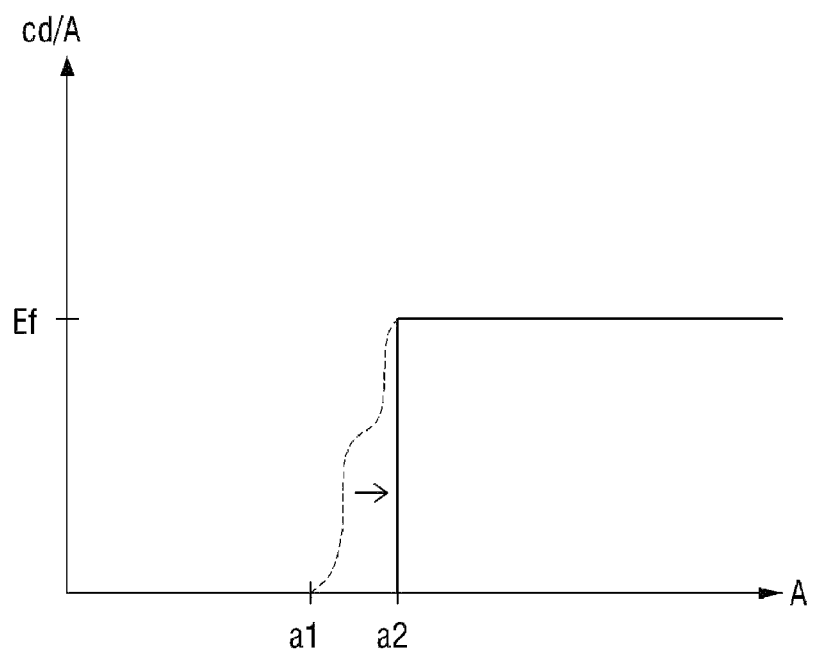
FIG. 4 is a graph illustrating an improvement in low gray level emission characteristics made by a second buffer layer located on a first pixel area of the organic light-emitting display of FIG. 1 according to exemplary embodiments of the present invention.

FIG. 4 is a graph illustrating an improvement in low gray level emission characteristics made by the second buffer layer 150b located on the first pixel area PA1 of the organic light-emitting display of FIG. 1 according to an exemplary embodiment of the invention. In FIG. 4, the horizontal axis may represent a current value, and the vertical axis may represent a luminance value (e.g., luminous efficiency) with respect to the current value.

Referring to FIG. 4, to stably drive the organic light-emitting display, the luminous efficiency of the first emitting layer 140a may be maintained constant regardless of the value of an electric current supplied to the first emitting layer 140a. However, the first emitting layer 140a including a fluorescent light-emitting material may exhibit unstable emission characteristics at low gray levels. Without the second buffer layer 150b, the luminous efficiency (represented by a dotted line in FIG. 4) of the first emitting layer 140a at low gray levels (low current values) may have an unstably increasing value instead of a constant value Ef. With the second buffer layer 150b, however, the luminous efficiency (represented by a solid line in FIG. 4) of the first emitting layer 140a at low gray levels may have a constant value Ef. More specifically, if the second buffer layer 150b having a relatively high LUMO level is located on a path of electrons from the first cathode 180a to the first emitting layer 140a, a current value (e.g., a threshold current value) from which the first emitting layer 140a starts to emit light may increase. For example, in FIG. 3, the absolute value (e.g., 0.3 eV) of the difference between the LUMO level $L_{ETL}$ of the electron transport layer 160 and the LUMO level $L_{B2}$ of the second buffer layer 150b may be greater than the absolute value (e.g., 0.2 eV) of the difference between the LUMO level $L_{ETL}$ of the electron transport layer 160 and the LUMO level $L_{B1}$ of the first buffer layer 150a, which may make it relatively difficult for electrons to move from the electron transport layer 160 to the second buffer layer 150b. More specifically, since the threshold current value increases from a1 to a2 in FIG. 4, the luminous efficiency represented by the dotted line may not affect the driving of the first emitting layer 140a. Consequently, the first emitting layer 140a can be driven stably at low gray levels.

Referring back to FIG. 2 and FIG. 3, the HOMO level $H_{E1}$ of the first emitting layer 140a, the HOMO level $H_{E2}$ of the second emitting layer 140b, the HOMO level $H_{B1}$ of the first buffer layer 150a, and the HOMO level $H_{B2}$ of the second buffer layer 150b may satisfy a relation of $H_{E2} > H_{B2} \geq H_{E1} > H_{B1}$. In addition, the LUMO level $L_{E1}$ of the first emitting layer 140a, the LUMO level $L_{E2}$ of the second emitting layer 140b, the LUMO level $L_{B1}$ of the first buffer layer 150a, and the LUMO level $L_{B2}$ of the second buffer layer 150b may satisfy a relation of $L_{E2} > L_{B2} > L_{B1} \geq L_{E1}$.

Figure 5:
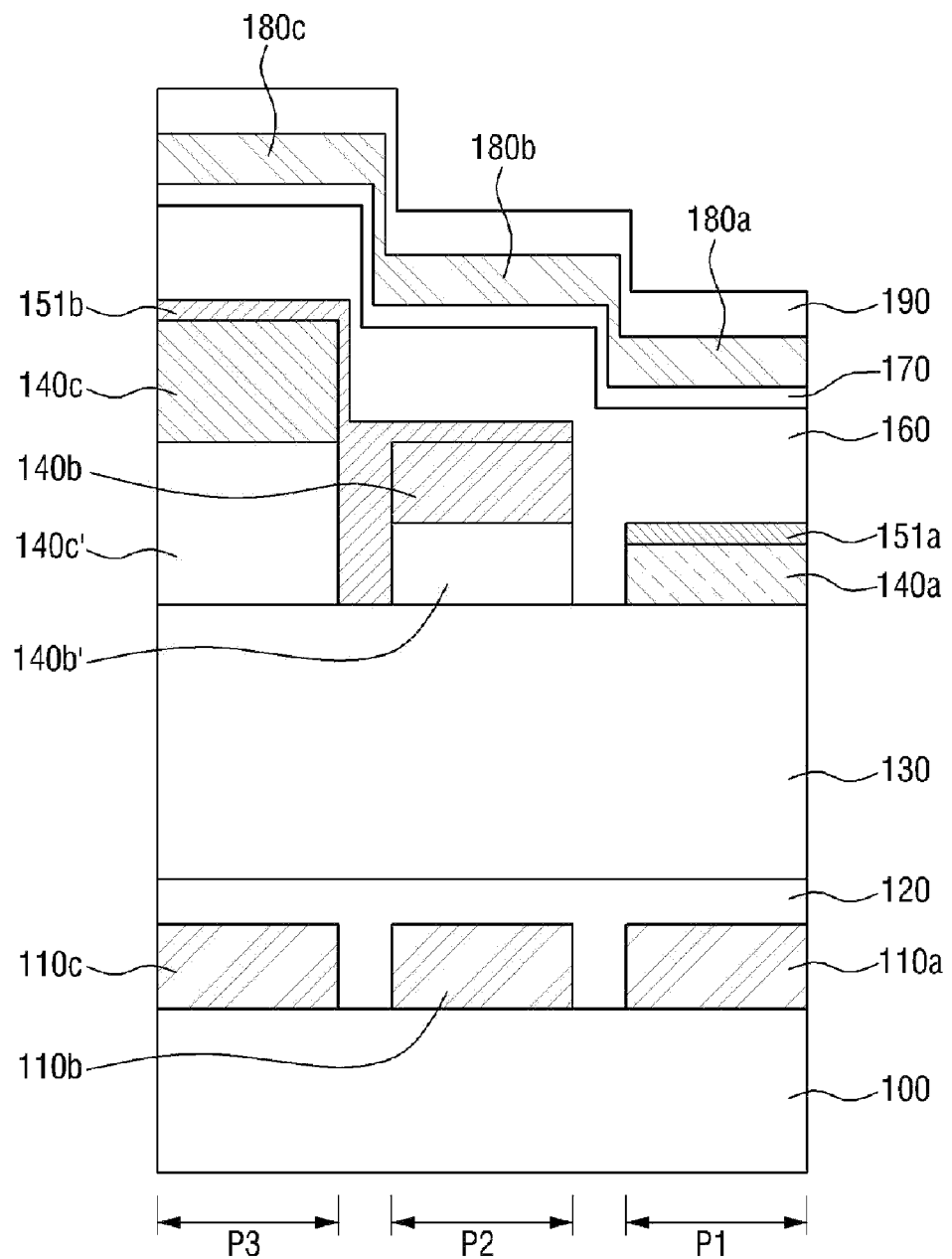
FIGS. 5 through 13 are schematic cross-sectional views of organic light-emitting displays according to exemplary embodiments of the present invention.

FIG. 5 is a schematic cross-sectional view of an organic light-emitting display according to an exemplary embodiment of the present invention. Elements substantially similar to those of FIG. 1 are indicated by like reference numerals, and description thereof will be omitted.

Referring to FIG. 5, a first buffer layer 151a may be substantially similar or the same as the first buffer layer 150a described above. However, a second buffer layer 151b may be disposed at a different position from the position of the second buffer layer 150b described above. More specifically, the second buffer layer 151b may be located or disposed on a second pixel area P2 and/or a third pixel area P3, but not on a first pixel area P1. Further, the second buffer layer 151b may be a common layer that may be disposed on the second pixel area P2 and the third pixel area P3, but not the first pixel area P1. The second buffer layer 151b may extend from a location between a second emitting layer 140b and an electron transport layer 160, to a location between a third emitting layer 140c and the electron transport layer 160. The second buffer layer 151b may be formed independently in a separate chamber.

Figure 6:
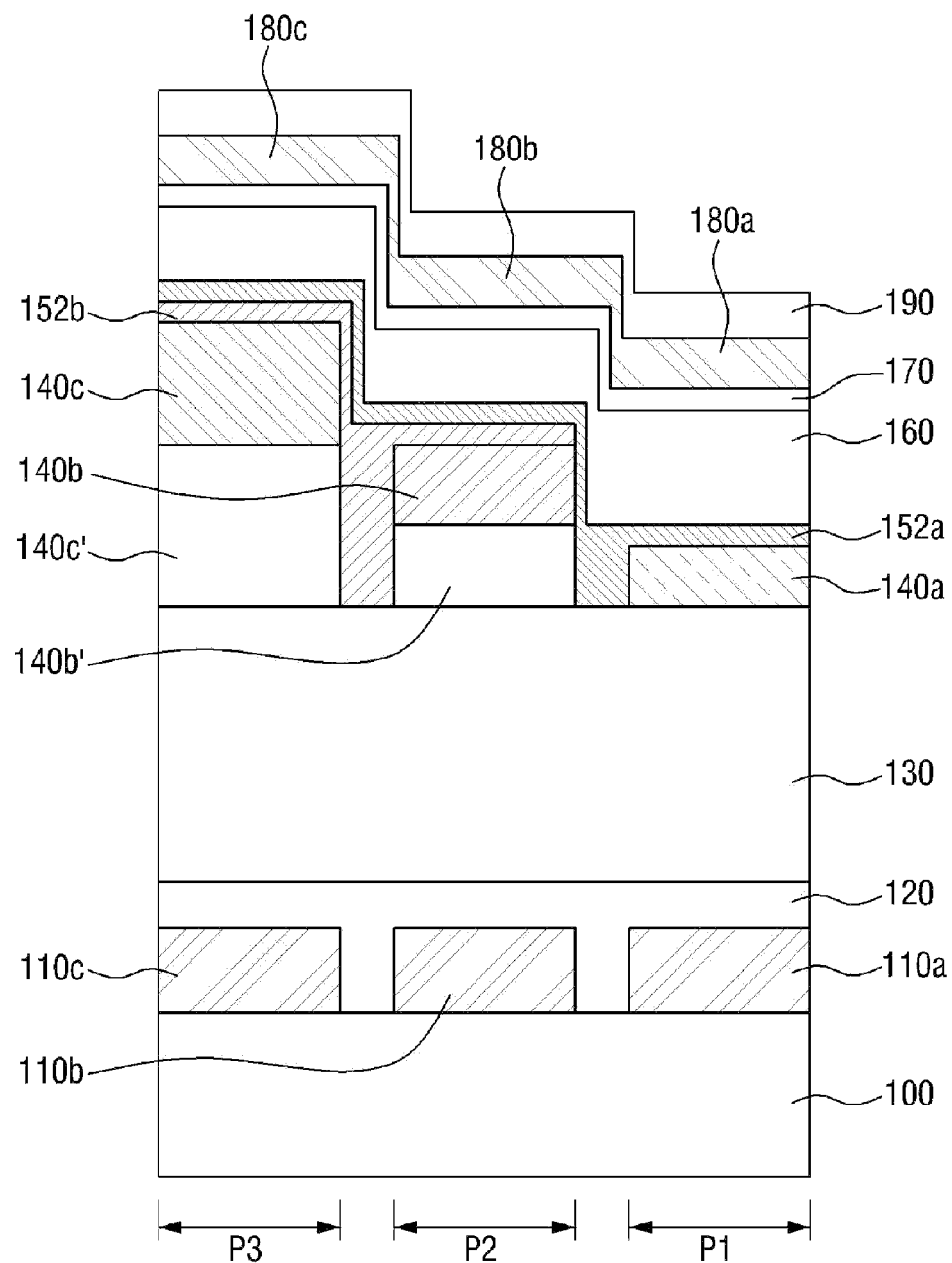

FIG. 6 is a schematic cross-sectional view of an organic light-emitting display according to an exemplary embodiment of the present invention. Elements substantially similar to those of FIG. 1 are indicated by like reference numerals, and description thereof will be omitted.

Referring to FIG. 6, a second buffer layer 152b may be substantially similar or the same as the second buffer layer 151b described above. However, a first buffer layer 152a may be disposed at a different position from the position of the first buffer layer 150a. More specifically, the first buffer layer 152a may be disposed as a single piece over the entire surface of a substrate 100, such that the first buffer layer 152a may be disposed as a common layer regardless of the division between pixels. Further, the first buffer layer 152a may be disposed on some or all of a plurality of pixel areas (first pixel area P1 through third pixel area P3). The first buffer layer 152a may extend from between a first emitting layer 140a and an electron transport layer 160 to between the second buffer layer 152b and the electron transport layer 160. More specifically, the first buffer layer 152a may be interposed between the second buffer layer 152b and the electron transport layer 160 on the second pixel area P2 and the third pixel area P3. In this case, the second buffer layer 152b may be disposed independently in a separate chamber, but the first buffer layer 152a may be disposed in the same chamber with the electron transport layer 160.

Figure 7:
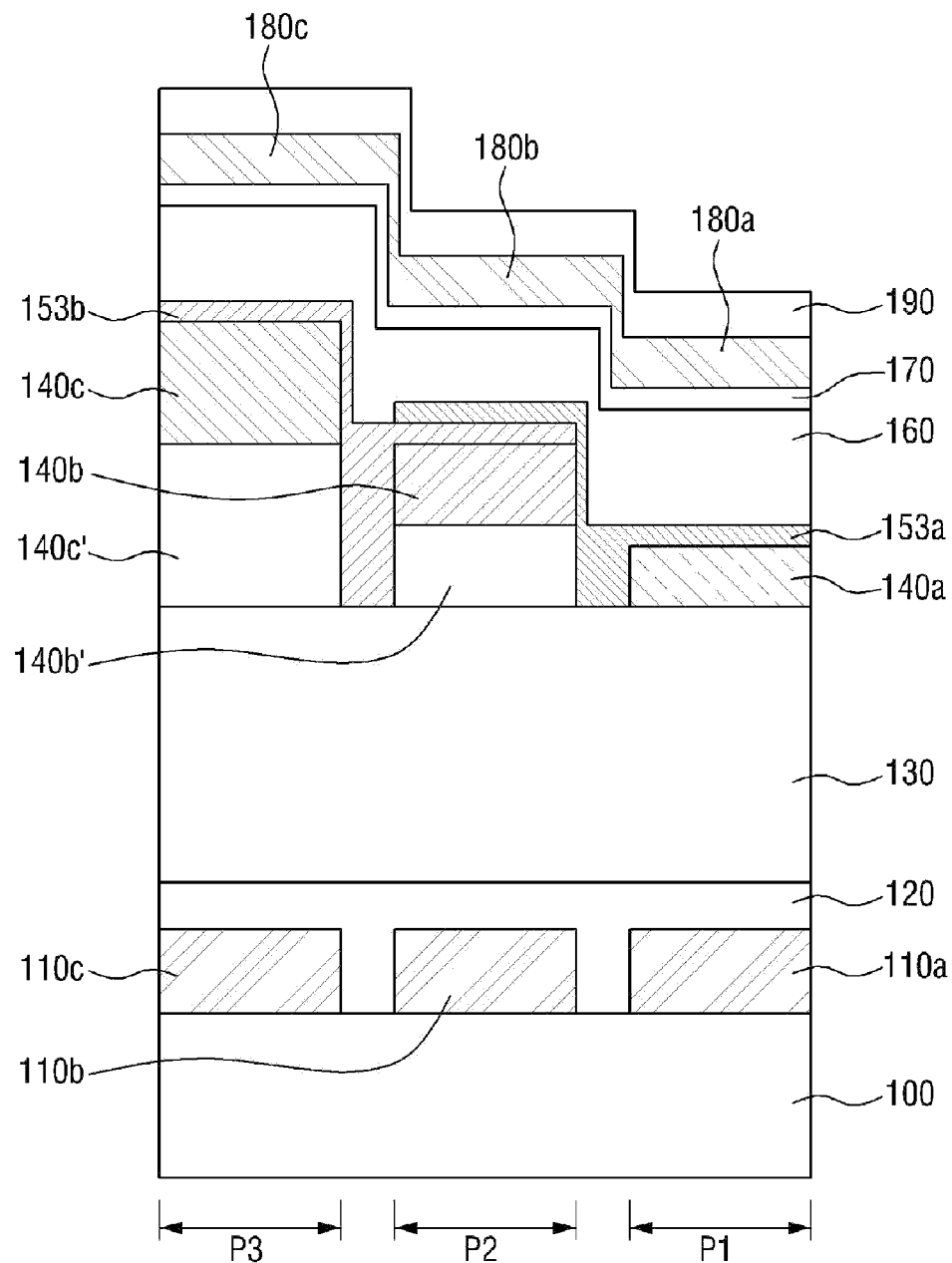

FIG. 7 is a schematic cross-sectional view of an organic light-emitting display according to an exemplary embodiment of the present invention. Elements substantially similar to those of FIG. 1 are indicated by like reference numerals, and description thereof will be omitted.

Referring to FIG. 7, a second buffer layer 153b may be substantially the same as the second buffer layer 151b described above. However, a first buffer layer 153a may be disposed at a different position from the position of the first buffer layer 150a described above. More specifically, the first buffer layer 153a may be disposed on a first pixel area P1 and a second pixel area P2, but not on a third pixel area P3. The first buffer layer 153a may be a common layer disposed on the first pixel area P1 and the second pixel area P2, but not on the third pixel area P3. Further, the first buffer layer 153a may extend from a location between a first emitting layer 140a and an electron transport layer 160 to a location between a second emitting layer 140b and the electron transport layer 160 disposed on the second pixel area P2. In this case, the first buffer layer 153a and the second buffer layer 153b may be formed independently in separate chambers.

Figure 8:
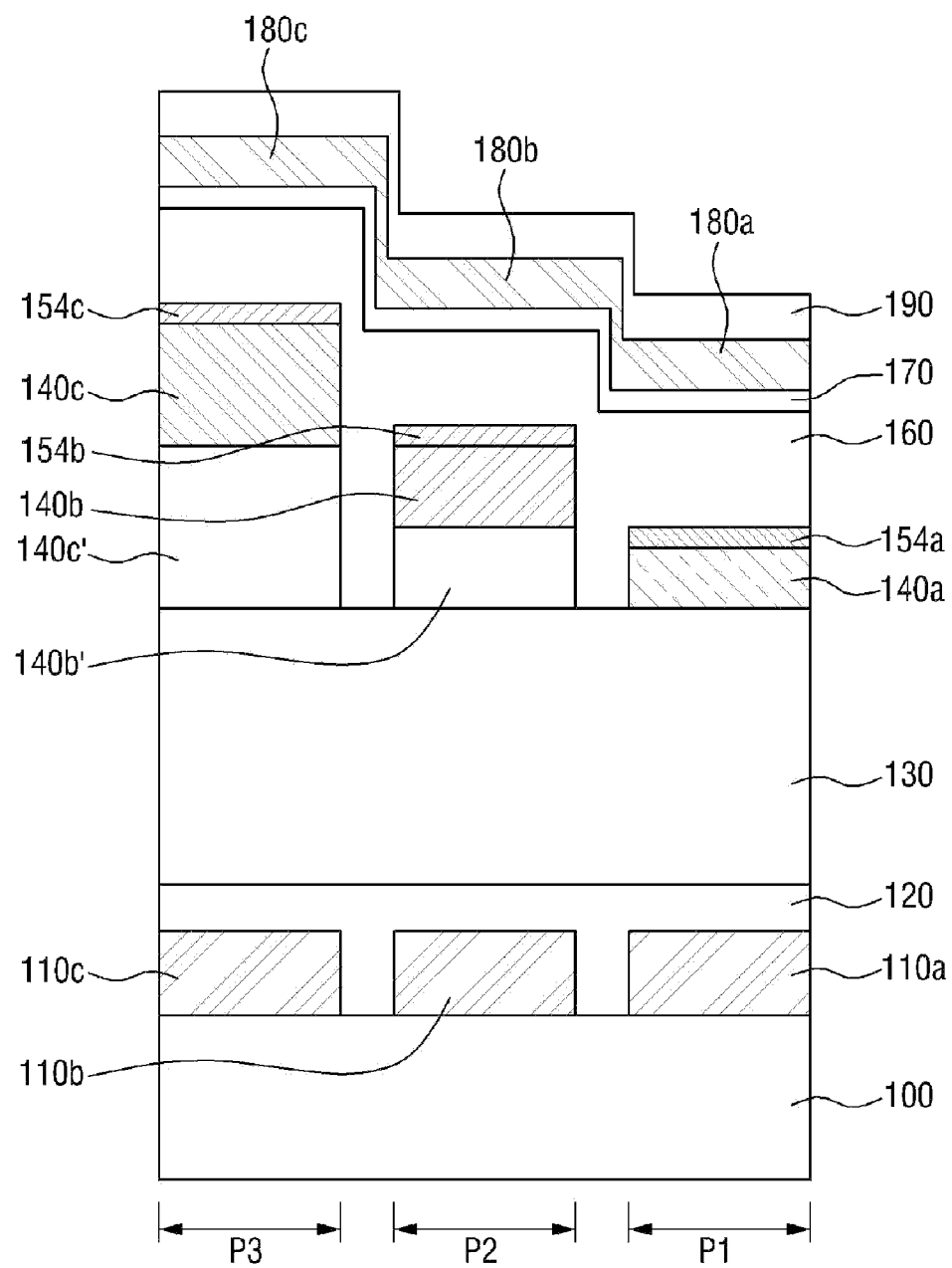

FIG. 8 is a schematic cross-sectional view of an organic light-emitting display according to an exemplary embodiment of the present invention. Elements substantially similar to those of FIG. 1 are indicated by like reference numerals, and description thereof will be omitted.

Referring to FIG. 8, a first buffer layer 154a may be substantially similar or the same as the first buffer layer 150a described above. However, a second buffer layer 154b may be located at a different position from the position of the second buffer layer 150b described above. More specifically, the second buffer layer 154b may be disposed between a second emitting layer 140b and an electron transport layer 160 on a second pixel area P2. However, the second buffer layer 154b may not be present on or over a first pixel area P1 or a third pixel area P3. Further, the second buffer layer 154b may be disposed in the same chamber with the second emitting layer 140b and a first auxiliary layer 140b'.

The organic light-emitting display of FIG. 8 further includes a third buffer layer 154c. The third buffer layer 154c may be formed of the same material as the second buffer layer 154b. The third buffer layer 154c may be disposed only between a third emitting layer 140c and the electron transport layer 160 on a third pixel area P3. However, the third buffer layer 154c may not be present on or over the first pixel area P1 or the second pixel area P2. The third buffer layer 154 may be disposed in the same chamber with the third emitting layer 140c and a second auxiliary layer 140c'.

Figure 9:
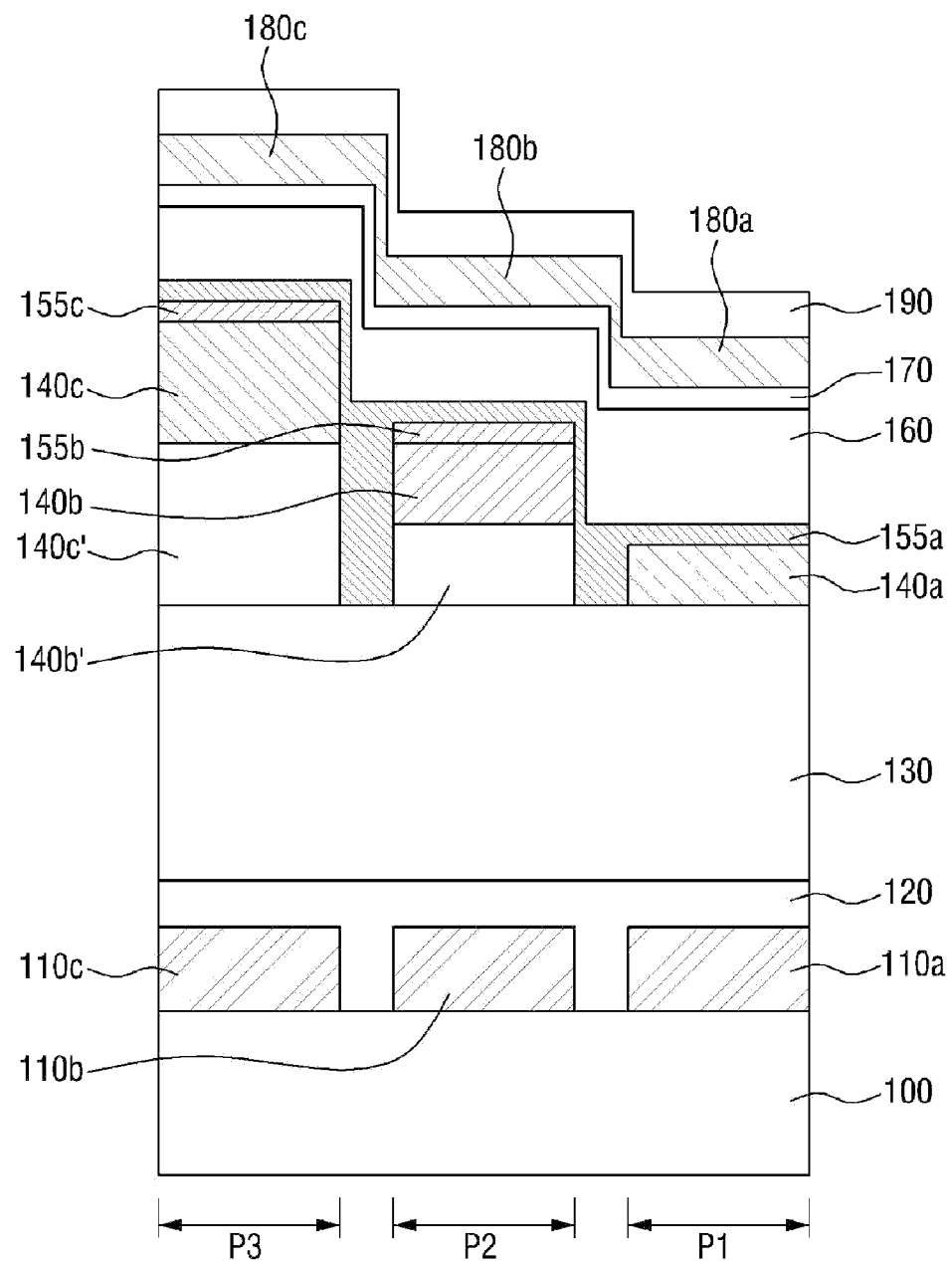

FIG. 9 is a schematic cross-sectional view of an organic light-emitting display according to an exemplary embodiment of the present invention. Elements substantially similar to those of FIG. 1 are indicated by like reference numerals, and description thereof will be omitted.

Referring to FIG. 9, a second buffer layer 155b and a third buffer layer 155c may be substantially similar or the same as the second buffer layer 154b and the third buffer layer 154c described above, respectively. However, a first buffer layer 155a may be disposed at a different position from the position of the first buffer layer 150a described above. More specifically, the first buffer layer 155a may be disposed as a single piece over the whole surface of a substrate 100. The first buffer layer 155a may be disposed as a common layer regardless of division between pixels. The first buffer layer 155a may be disposed on some or all of a plurality of pixel areas (first pixel area P1 through third pixel area P3). The first buffer layer 155a may extend from a location between a first emitting layer 140a and an electron transport layer 160 to a location between the second buffer layer 155b and the electron transport layer 160 and a location between the third buffer layer 155c and the electron transport layer 160. The first buffer layer 155a may be disposed in the same chamber with the electron transport layer 160.

Figure 10:
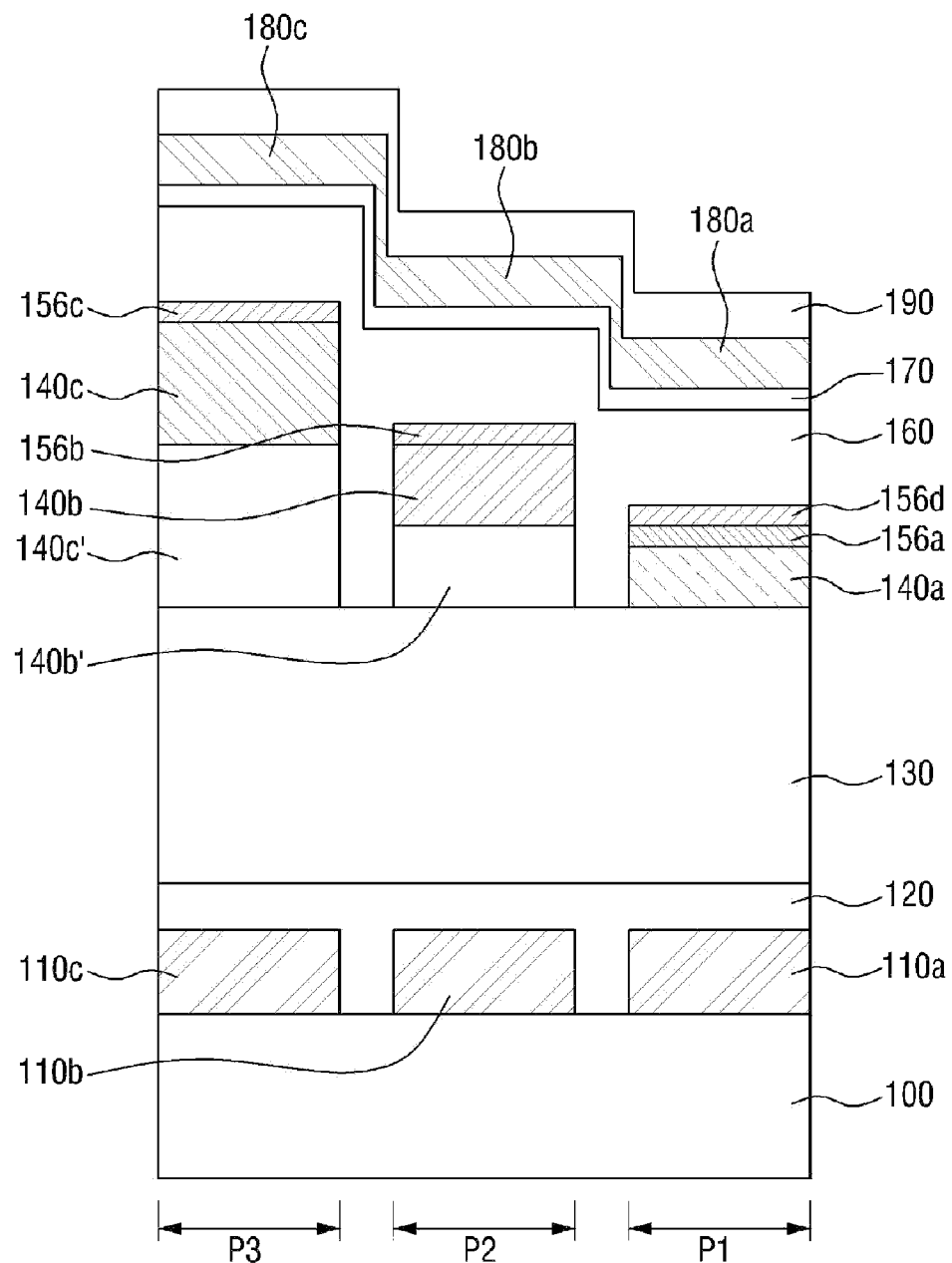

FIG. 10 is a schematic cross-sectional view of an organic light-emitting display according to an exemplary embodiment of the present invention. Elements substantially similar to those of FIG. 1 are indicated by like reference numerals, and description thereof will be omitted.

Referring to FIG. 10, a first buffer layer 156a, a second buffer layer 156b, and a third buffer layer 156c may be substantially similar or the same as the first buffer layer 154a, the second buffer layer 154b, and the third buffer layer 154c described above, respectively. However, the organic light-emitting display of FIG. 10 may further include a fourth buffer layer 156d. The fourth buffer layer 156d may be interposed between the first buffer layer 156a and an electron transport layer 160. The fourth buffer layer 156d may be formed of the same material as the second buffer layer 156b and/or the third buffer layer 156c. The fourth buffer layer 156d may be disposed in the same chamber with the first buffer layer 156a and a first emitting layer 140a.

Figure 11:
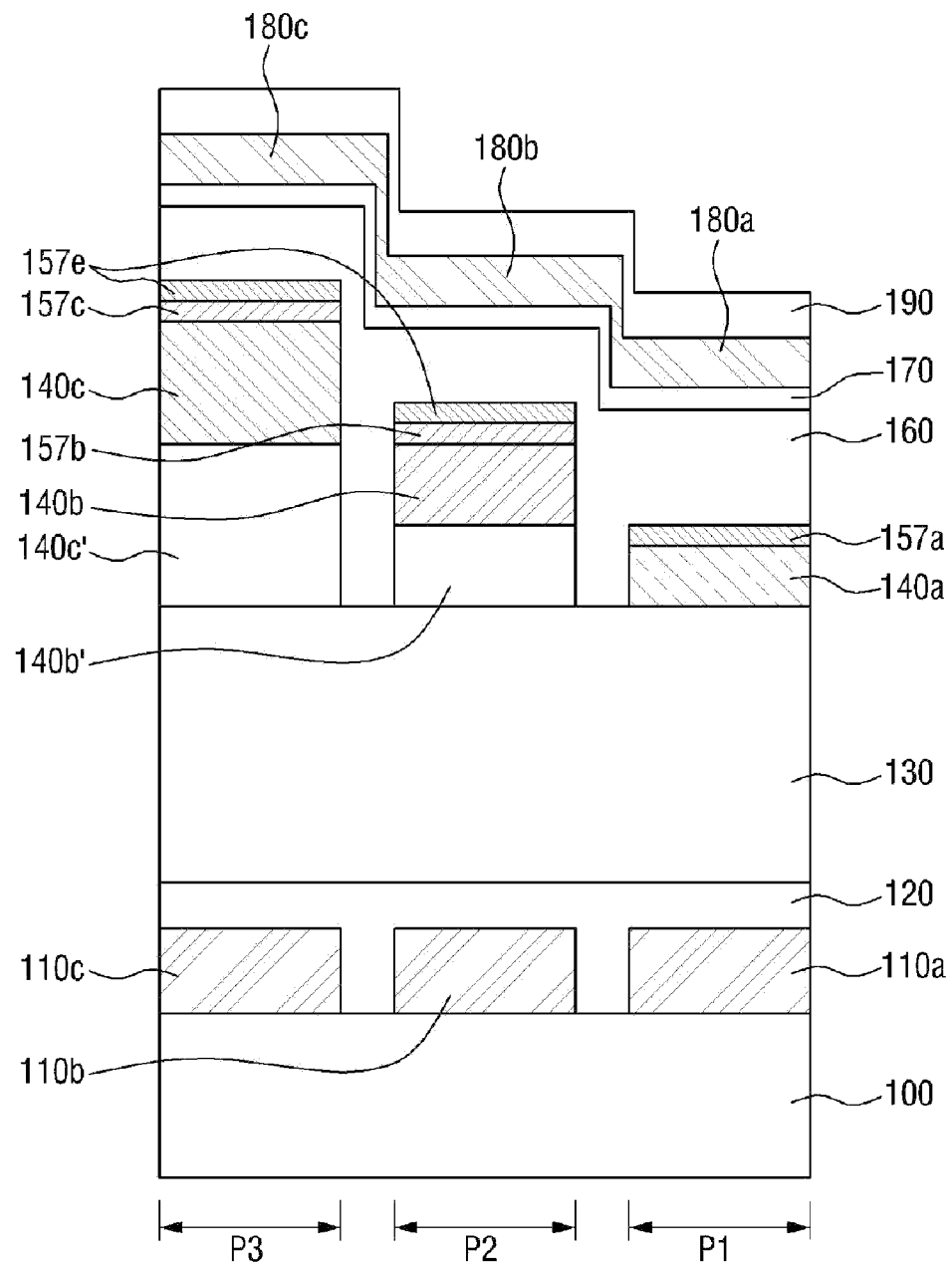

FIG. 11 is a schematic cross-sectional view of an organic light-emitting display according to an exemplary embodiment of the present invention. Elements substantially similar to those of FIG. 1 are indicated by like reference numerals, and description thereof will be omitted.

Referring to FIG. 11, a first buffer layer 157a, a second buffer layer 157b, and a third buffer layer 157c may be substantially similar or the same as the first buffer layer 154a, the second buffer layer 154b, and the third buffer layer 154c described above. However, the organic light-emitting display of FIG. 11 may further include a fifth buffer layer 157e. The fifth buffer layer 157e may be formed of the same material as the first buffer layer 157a. The fifth buffer layer 157e may be formed in a plurality. One of the fifth buffer layers 157e may be interposed between the second buffer layer 157b and an electron transport layer 160 on the second pixel area P2, and the other one of the fifth buffer layers 157e may be interposed between the third buffer layer 157c and the electron transport layer 160 on the third pixel area P3. The fifth buffer layer 157e interposed between the second buffer layer 157b and the electron transport layer 160 may be disposed in the same chamber with the second buffer layer 157b. The fifth buffer layer 157e interposed between the third buffer layer 157c and the electron transport layer 160 may be disposed in the same chamber with the third buffer layer 157c.

Figure 12:
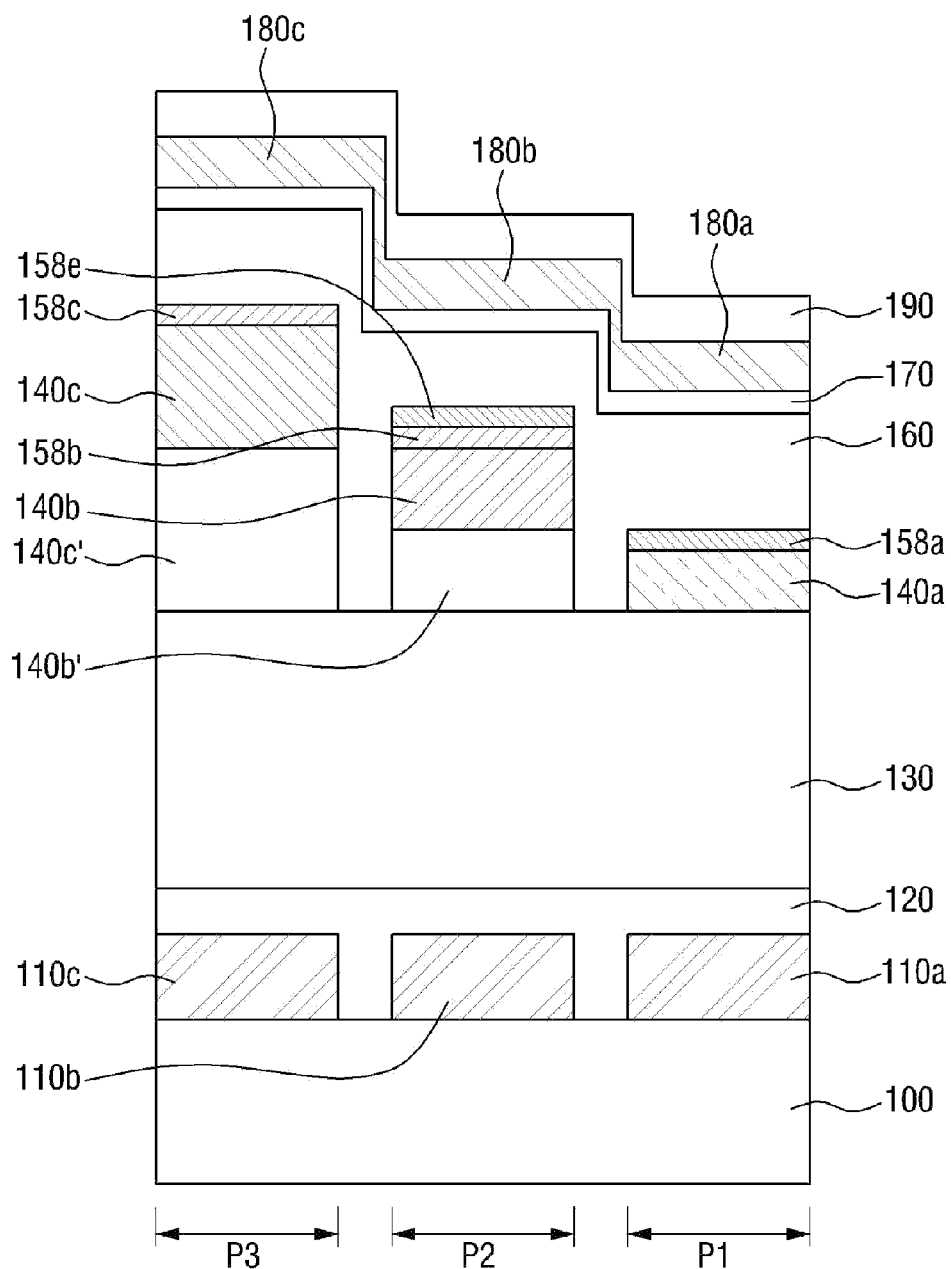

FIG. 12 is a schematic cross-sectional view of an organic light-emitting display according to an exemplary embodiment of the present invention. Elements similar to those of FIG. 1 are indicated by like reference numerals, and description thereof will be omitted.

Referring to FIG. 12, a first buffer layer 158a, a second buffer layer 158b, and a third buffer layer 158c may be similar to the first buffer layer 154a, the second buffer layer 154b, and the third buffer layer 154c described above, respectively. However, a fifth buffer layer 158e may be disposed at a different position from the position of the fifth buffer layer 157e described above. More specifically, the fifth buffer layer 158e may be interposed between the second buffer layer 158b and an electron transport layer 160 on a second pixel area P2, but not present on a first pixel area P1 or a third pixel area P3. The fifth buffer layer 158e may be disposed in the same chamber with the second buffer layer 158b.

Figure 13:
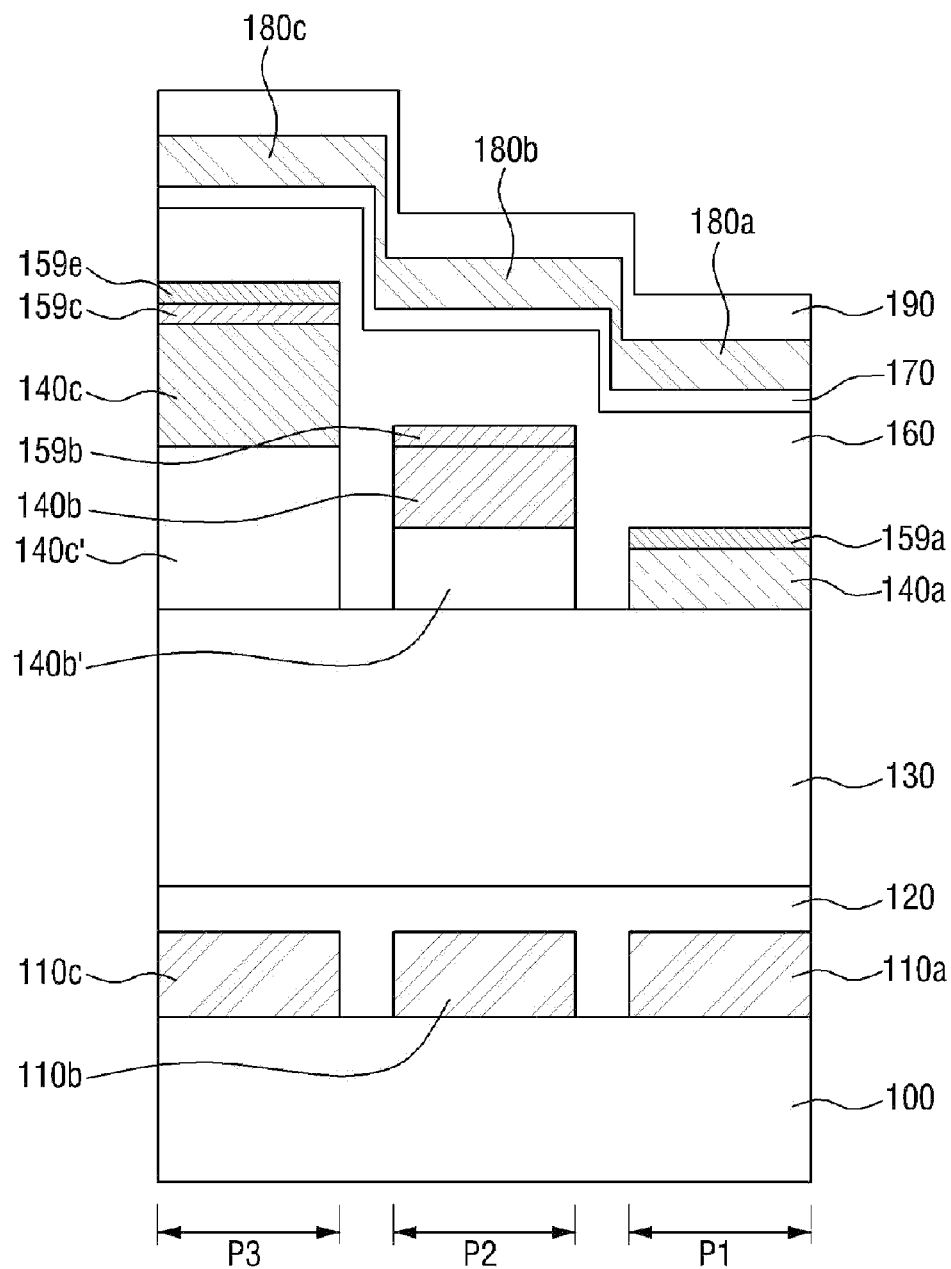

FIG. 13 is a schematic cross-sectional view of an organic light-emitting display according to an exemplary embodiment of the present invention. Elements similar to those of FIG. 1 are indicated by like reference numerals, and description thereof will be omitted.

Referring to FIG. 13, a first buffer layer 159a, a second buffer layer 159b, and a third buffer layer 159c may be similar to the first buffer layer 154a, the second buffer layer 154b, and the third buffer layer 154c described above, respectively. However, a fifth buffer layer 159e may be disposed at a different position from the position of the fifth buffer layer 157e described above. More specifically, the fifth buffer layer 159e may be interposed between the third buffer layer 159c and an electron transport layer 160 on a third pixel area P3, but not present on a first pixel area P1 or a second pixel area P2. The fifth buffer layer 159e may be disposed in the same chamber with the third buffer layer 159c.

Hereinafter, a method for fabricating an organic light-emitting display according to an exemplary embodiment of the present invention and comparative examples of fabricating an organic light-emitting display will be described and compared.

Inventive Example

A first anode 110a, a second anode 110b, and a third anode 110c may be formed to a thickness of 1000 Å on a first pixel area P1, a second pixel area P2, and a third pixel area P3, respectively, of a substrate 100 by depositing ITO on the substrate 100 using a sputtering method. The substrate 100 may have $SiO_2$ as its main component.

NPB may be deposited on the first anode 110a, the second anode 110b, and the third anode 110c and doped with hexanitrile hexaazatriphenylene, thereby forming a P-hole transport layer 120 to a thickness of 100 Å.

A hole transport layer 130 may be formed to a thickness of 1200 Å by depositing NPB on the P-hole transport layer 120.

A first emitting layer 140a may be formed to a thickness of 200 Å by depositing ADN and DPAVBi on the hole transport layer 130 of the first pixel area P1. Then, a first buffer layer 150a may be formed to a thickness of 50 Å by depositing firpic in the same chamber as the chamber in which the first emitting layer 140a may have been formed.

A first auxiliary layer 140b' may be formed to a thickness of 300 Å by depositing NPB on the hole transport layer 130 of the second pixel area P2. Then, a second emitting layer 140b was formed to a thickness of 400 Å by depositing ADN and Ir(ppy)$_3$ (ppy=2-phenylpyridine) in the same chamber as the chamber in which the first auxiliary layer 140b' may have been formed.

A second auxiliary layer 140c' may be formed to a thickness of 800 Å by depositing NPB on the hole transport layer 130 of the third pixel area P3. Then, a third emitting layer 140c may be formed to a thickness of 400 Å by depositing ADN and 4-(dicyanomethylene)-2-t-butyl-6-(1, 1,7,7-tetramethyljulolidyl-9-enyl)-4H-pyran (4-(dicyanomethylene)-2-t-butyl-6-(1,1,7,7-tetramethyljulolidyl-9-enyl)-4H-pyran (DCJTB) in the same chamber as the chamber in which the second auxiliary layer 140c' may have been formed.

A second buffer layer 150b may be formed to a thickness of 50 Å by depositing CBP on some or all of the first buffer layer 150a, the second emitting layer 140b, and the third emitting layer 140c.

An electron transport layer 160 may be formed to a thickness of 310 Å by depositing Alq₃ and Liq on the second buffer layer 150b.

An electron injecting layer 170 may be formed to a thickness of 15 Å by depositing LiF on the electron transport layer 160.

A first cathode 180a, a second cathode 180b, and a third cathode 180c may be formed to a thickness of 140 Å by depositing Mg and Ag on the electron injecting layer 170.

A passivation layer 190 may be formed to a thickness of 600 Å by depositing SiNx on the first cathode 180a, the second cathode 180b, and the third cathode 180c.

Comparative Example 1

Comparative Example 1, although similar to above, omits the first buffer layer 150a and the second buffer layer 150b.

Comparative Example 2

Comparative Example 2, although similar to the Inventive Example, omits the second buffer layer 150b.

Comparative Example 3

Comparative Example 3, although similar to the above exemplary embodiment, the first buffer layer 150a may be formed immediately after the formation of the second buffer layer 150b. More specifically, the first buffer layer 150a may be formed between the second buffer layer 150b and the electron transport layer 160 on the first pixel area P1. The first buffer layer 150a and the second buffer layer 150b may be stacked on the first pixel area P1 in a different order from the order described in the Inventive Example.

Luminous efficiencies of Inventive and Comparative Examples are compared below.

TABLE 1

| | Comparative Example 1 | Comparative Example 2 | Comparative Example 3 | Inventive Example |
|---|---|---|---|---|
| Luminous efficiency (cd/A) of first emitting layer | 4.85 | 4.85 | 4.475 | 5.785 |
| Luminous efficiency (cd/A) of second emitting layer | 89.8 | 107.4 | 107.4 | 107.4 |
| Luminous efficiency (cd/A) of third emitting layer | 51.6 | 54.2 | 54.2 | 54.2 |

As described above, in an organic light-emitting display according to exemplary embodiments of the present invention, luminous efficiencies of the first emitting layer 140a, the second emitting layer 140b, and the third emitting layer 140c can all be improved to more than a certain level.

Aspects of the present invention provide at least one of the following advantages.

More specifically, it may be possible to provide an organic light-emitting display having a longer life, higher reliability and higher luminous efficiency.

However, aspects of the invention are not limited thereto, such that other benefits or effects may be provided.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An organic light-emitting display, comprising:
a substrate comprising a first pixel area configured to emit a light of a first color and a second pixel area configured to emit a light of a second color different from the first color;
a first anode disposed on the first pixel area and a second anode disposed on the second pixel area;
a hole transport layer disposed on the first anode and the second anode;
a first emitting layer disposed solely on the first anode and a second emitting layer disposed solely on the second anode, the first emitting layer comprising a fluorescent light-emitting material and the second emitting layer comprising a first phosphorescent light-emitting material;
a first buffer layer disposed on the first emitting layer and a second buffer layer disposed on the second emitting layer, the first buffer layer and the second buffer layer being formed of different materials;
an electron transport layer disposed on the first buffer layer and the second buffer layer; and
a first cathode disposed on the first buffer layer and a second cathode disposed on the second buffer layer,
wherein the first buffer layer is disposed between the first emitting layer and the first cathode, and the second buffer layer is disposed between the second emitting layer and the second cathode,
wherein the first buffer layer and the second buffer layer are disposed between the hole transport layer and the electron transport layer, and
wherein the first emitting layer is in direct contact with the first buffer layer and the second buffer layer.

2. The organic light-emitting display of claim 1, wherein a highest occupied molecular orbital (HOMO) level and a lowest unoccupied molecular orbital (LUMO) level of the first buffer layer are lower than a HOMO level and a LUMO level of the second buffer layer, respectively.

3. The organic light-emitting display of claim 1, wherein a HOMO level of the first buffer layer is lower than a HOMO level of the first emitting layer, and an absolute value of a difference between the HOMO level of the first buffer layer and the HOMO level of the first emitting layer is 0.2 eV or more.

4. The organic light-emitting display of claim 1, wherein a HOMO level of the second buffer layer is lower than a HOMO level of the second emitting layer and higher than or equal to a HOMO level of the first emitting layer.

5. The organic light-emitting display of claim 1, wherein a HOMO level of the first emitting layer, a HOMO level of the second emitting layer, a HOMO level of the first buffer layer, and a HOMO level of the second buffer layer satisfy the below relationship:
the HOMO level of the second emitting layer >the HOMO level of the second buffer layer ≥the HOMO level of the first emitting layer >the HOMO level of the first buffer layer.

6. The organic light-emitting display of claim 1, wherein a LUMO level of the first buffer layer is lower than a LUMO level of the second buffer layer and higher than or equal to a LUMO level of the first emitting layer.

7. The organic light-emitting display of claim 1, wherein a LUMO level of the second buffer layer is lower than a LUMO level of the second emitting layer and higher than a LUMO level of the first emitting layer.

8. The organic light-emitting display of claim 1, wherein a LUMO level of the first emitting layer, a LUMO level of the second emitting layer, a LUMO level of the first buffer layer, and a LUMO level of the second buffer layer satisfy the below relationship:

the LUMO level of the second emitting layer >the LUMO level of the second buffer layer >the LUMO level of the first buffer layer ≥the LUMO level of the first emitting layer.

9. The organic light-emitting display of claim 1, wherein the substrate further comprises:

a third pixel area configured to emit a light of a third color different from the first color and the second color;

a third anode disposed on the third pixel area of the substrate;

a third emitting layer disposed on the third anode, the third emitting layer comprising a second phosphorescent light-emitting material different from the first phosphorescent light-emitting material; and a third cathode disposed on the third emitting layer, wherein the second buffer layer extends to a position between the third emitting layer and the third cathode.

10. The organic light-emitting display of claim 9, wherein the second buffer layer extends to a position between the first buffer layer and the first cathode.

11. The organic light-emitting display of claim 9, wherein the first buffer layer extends to a position between the second buffer layer and the third buffer layer and to a position between the second cathode and the third cathode.

12. The organic light-emitting display of claim 1, wherein the substrate further comprises:

a third pixel area configured to emit a light of a third color different from the first color and the second color;

a third anode disposed on the third pixel area of the substrate;

a third emitting layer disposed on the third anode, the third emitting layer comprising a second phosphorescent light-emitting material different from the first phosphorescent light-emitting material;

a third buffer layer disposed on the third emitting layer and formed of the same material as the second buffer layer; and a third cathode disposed on the third buffer layer.

13. The organic light-emitting display of claim 12, wherein the first buffer layer extends to a position between the second buffer layer and the third buffer layer and extends to a position between the second cathode and the third cathode.

14. The organic light-emitting display of claim 12, further comprising a fourth buffer layer interposed between the first buffer layer and the first cathode, wherein the fourth buffer is formed of the same material as the second buffer layer.

15. The organic light-emitting display of claim 12, further comprising a fifth buffer layer disposed in a position between the second buffer layer and the third buffer layer and disposed in a position between the second cathode and the third cathode, wherein the fifth buffer layer is formed of the same material as the first buffer layer.

16. An organic light-emitting display, comprising:

a first pixel area disposed on a substrate and configured to emit a light of a first color;

a second pixel area disposed on the substrate and configured to emit a light of a second color different from the first color;

a first anode disposed across from a first cathode;

a first emitting layer interposed solely between the first anode and the first cathode, the first emitting layer comprising a fluorescent light-emitting material;

a first buffer layer interposed between the first emitting layer and the first cathode, the first buffer layer disposed on the first pixel area;

a second anode disposed across from a second cathode;

a second emitting layer interposed solely between the second anode and the second cathode, the second emitting layer comprising a phosphorescent light-emitting material;

a second buffer layer interposed between the second emitting layer and the second cathode, the second buffer layer disposed on the second pixel area;

a hole transport layer disposed on the first anode and the second anode; and an electron transport layer disposed on the first cathode and the second cathode, wherein a highest occupied molecular orbital (HOMO) level and a lowest unoccupied molecular orbital (LUMO) level of the first buffer layer are lower than a HOMO level and a LUMO level of the second buffer layer, wherein the first buffer layer and the second buffer layer are disposed between the hole transport layer and the electron transport layer, and wherein the first emitting layer is in direct contact with the first buffer layer and the second buffer layer.

17. The organic light emitting display of claim 16, wherein a HOMO level of the first emitting layer, a HOMO level of the second emitting layer, the HOMO level of the first buffer layer, and the HOMO level of the second buffer layer satisfy the below relationship:

the HOMO level of the second emitting layer >the HOMO level of the second buffer layer ≥the HOMO level of the first emitting layer >the HOMO level of the first buffer layer.

18. The organic light-emitting display of claim 16, wherein a LUMO level of the first emitting layer, a LUMO level of the second emitting layer, the LUMO level of the first buffer layer, and the LUMO level of the second buffer layer satisfy the below relationship:

the LUMO level of the second emitting layer >the LUMO level of the second buffer layer >the LUMO level of the first buffer layer ≥the LUMO level of the first emitting layer.

19. An organic light-emitting display, comprising:

a substrate comprising a first pixel area configured to emit a light of a first color;

a first anode disposed on the first pixel area of the substrate;

a first emitting layer disposed solely on the first anode, the first emitting layer comprising a fluorescent light-emitting material;

a first buffer layer disposed on the first emitting layer;

a second buffer layer disposed on the first buffer layer; and a first cathode disposed on the second buffer layer, wherein a highest occupied molecular orbital (HOMO) level and a lowest unoccupied molecular orbital (LUMO) level of the first buffer layer are lower than a HOMO level and a LUMO level of the second buffer layer, and wherein the substrate further comprises:

a second pixel area configured to emit a light of a second color different from the first color;

a second anode disposed on the second pixel area of the substrate;

a second emitting layer disposed solely on the second anode, the second emitting layer comprising a phosphorescent light-emitting material;

a second cathode disposed on the second emitting layer, a hole transport layer disposed on the first anode and the second anode; and an electron transport layer disposed on the first cathode and the second cathode;

wherein the second buffer layer extends to a position between the second emitting layer and the second cathode, wherein the first buffer layer is disposed between the first emitting layer and the first cathode, and the second buffer layer is disposed between the second emitting layer and the second cathode, wherein the first buffer layer and the second buffer layer are disposed between the hole transport layer and the electron transport layer, and wherein the first emitting layer is in direct contact with the first buffer layer and the second buffer layer.

* * * * *